(12) United States Patent
Berger et al.

(10) Patent No.: US 9,576,844 B2
(45) Date of Patent: Feb. 21, 2017

(54) METHOD FOR MANUFACTURING A COMPOSITE WAFER HAVING A GRAPHITE CORE, AND COMPOSITE WAFER HAVING A GRAPHITE CORE

(71) Applicant: Infineon Technologies AG, Neubiberg (DE)

(72) Inventors: Rudolf Berger, Regensburg (DE); Hermann Gruber, Woerth an der Donau (DE); Wolfgang Lehnert, Lintach (DE); Guenther Ruhl, Regensburg (DE); Raimund Foerg, Straubing (DE); Anton Mauder, Kolbermoor (DE); Hans-Joachim Schulze, Taufkirchen (DE); Karsten Kellermann, Altdorf (DE); Michael Sommer, Nuremberg (DE); Christian Rottmair, Erlangen (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/962,393

(22) Filed: Dec. 8, 2015

(65) Prior Publication Data
US 2016/0086844 A1  Mar. 24, 2016

Related U.S. Application Data

(60) Continuation of application No. 14/340,186, filed on Jul. 24, 2014, now Pat. No. 9,224,633, which is a
(Continued)

(51) Int. Cl.
*H01L 21/30* (2006.01)
*H01L 21/762* (2006.01)
(Continued)

(52) U.S. Cl.
CPC ....... *H01L 21/76254* (2013.01); *C30B 25/186* (2013.01); *H01L 21/02115* (2013.01);
(Continued)

(58) Field of Classification Search
CPC ............... H01L 21/02002; H01L 21/76254; H01L 21/2007; H01L 21/02115; H01L 21/02527; H01L 29/02; H01L 21/324; H01L 21/02013; H01L 21/76251; H01L 21/3212
See application file for complete search history.

(56) References Cited

U.S. PATENT DOCUMENTS 4,534,951 A  8/1985  Kortovich et al.
5,374,329 A  12/1994  Miyawaki
(Continued)

FOREIGN PATENT DOCUMENTS

CN  1894795 A  1/2007
CN  101295758 A  10/2008
(Continued)

*Primary Examiner* — Khiem D Nguyen
(74) *Attorney, Agent, or Firm* — Murphy, Bilak & Homiller, PLLC

(57) ABSTRACT

A composite wafer is manufactured by providing a carrier wafer including graphite and a protective layer, forming a bonding layer, and bonding the carrier wafer to a semiconductor wafer through the bonding layer.

17 Claims, 12 Drawing Sheets

Related U.S. Application Data division of application No. 13/206,029, filed on Aug. 9, 2011, now Pat. No. 8,822,306, which is a continuation-in-part of application No. 12/894,344, filed on Sep. 30, 2010, now Pat. No. 8,404,562.

(51) Int. Cl.
| | |
|---|---|
| H01L 21/02 | (2006.01) |
| H01L 21/20 | (2006.01) |
| C30B 25/18 | (2006.01) |
| H01L 21/324 | (2006.01) |
| H01L 21/265 | (2006.01) |
| H01L 21/321 | (2006.01) |
| H01L 29/16 | (2006.01) |
| H01L 29/20 | (2006.01) |

(52) U.S. Cl.
CPC .. *H01L 21/02282* (2013.01); *H01L 21/02598* (2013.01); *H01L 21/2007* (2013.01); *H01L 21/265* (2013.01); *H01L 21/324* (2013.01); *H01L 21/3212* (2013.01); *H01L 21/76251* (2013.01); *H01L 29/1608* (2013.01); *H01L 29/20* (2013.01); *H01L 29/2003* (2013.01)

(56) References Cited

U.S. PATENT DOCUMENTS

| | | | |
|---|---|---|---|
| 5,603,779 A | 2/1997 | Linn et al. | |
| 5,744,852 A | 4/1998 | Linn et al. | |
| 5,770,468 A | 6/1998 | Kosaki | |
| 6,353,528 B1 | 3/2002 | Hori et al. | |
| 6,458,672 B1* | 10/2002 | Henley | B81C 1/0038 257/E21.568 |
| 7,491,342 B2 | 2/2009 | Kamiyama et al. | |
| 7,741,632 B2 | 6/2010 | Xiong et al. | |
| 8,822,306 B2* | 9/2014 | Berger | H01L 21/02115 438/455 |
| 2006/0040469 A1 | 2/2006 | Aga et al. | |
| 2006/0118935 A1* | 6/2006 | Kamiyama | H01L 21/30608 257/684 |
| 2006/0284167 A1* | 12/2006 | Augustine | H01L 21/2007 257/40 |
| 2008/0001274 A1 | 1/2008 | Deleonibus | |
| 2008/0128751 A1* | 6/2008 | Langdo | H01L 21/28518 257/191 |
| 2008/0248251 A1* | 10/2008 | Ghyselen | H01L 21/3148 428/156 |
| 2008/0265265 A1* | 10/2008 | Xiong | H01L 33/641 257/97 |
| 2009/0042364 A1* | 2/2009 | Yagi | H01L 21/76254 438/459 |
| 2010/0323164 A1* | 12/2010 | Ogihara | H01L 21/2007 428/156 |

FOREIGN PATENT DOCUMENTS

| | | |
|---|---|---|
| DE | 10043587 A1 | 7/2001 |
| DE | 10318283 A1 | 11/2004 |
| WO | 2004095552 A2 | 11/2004 |

\* cited by examiner

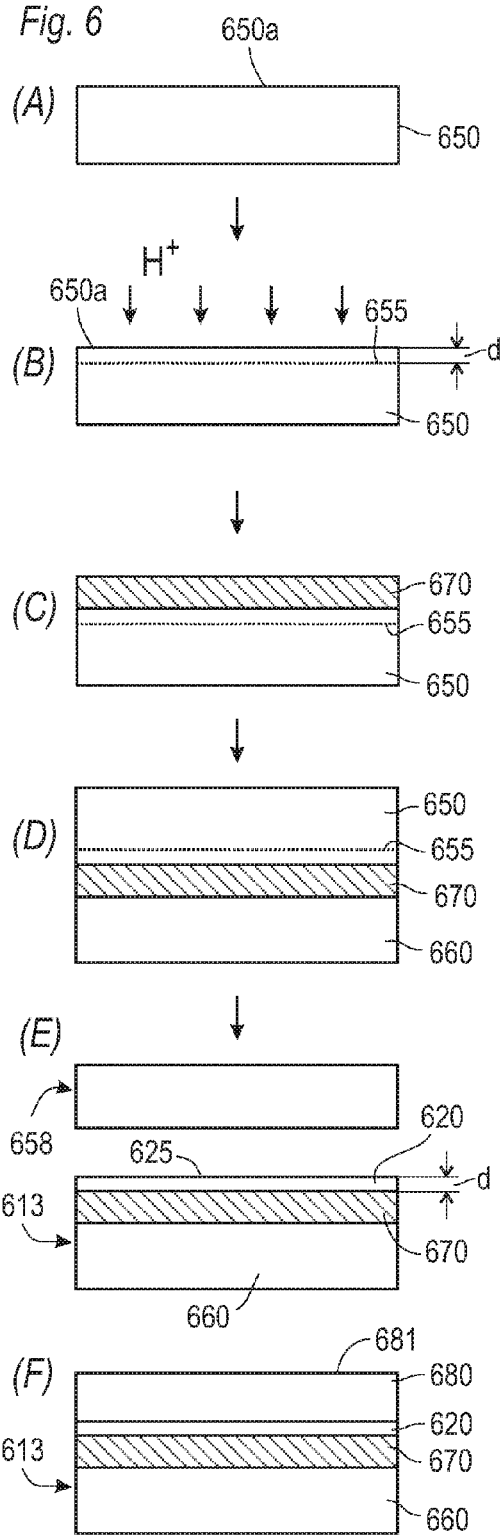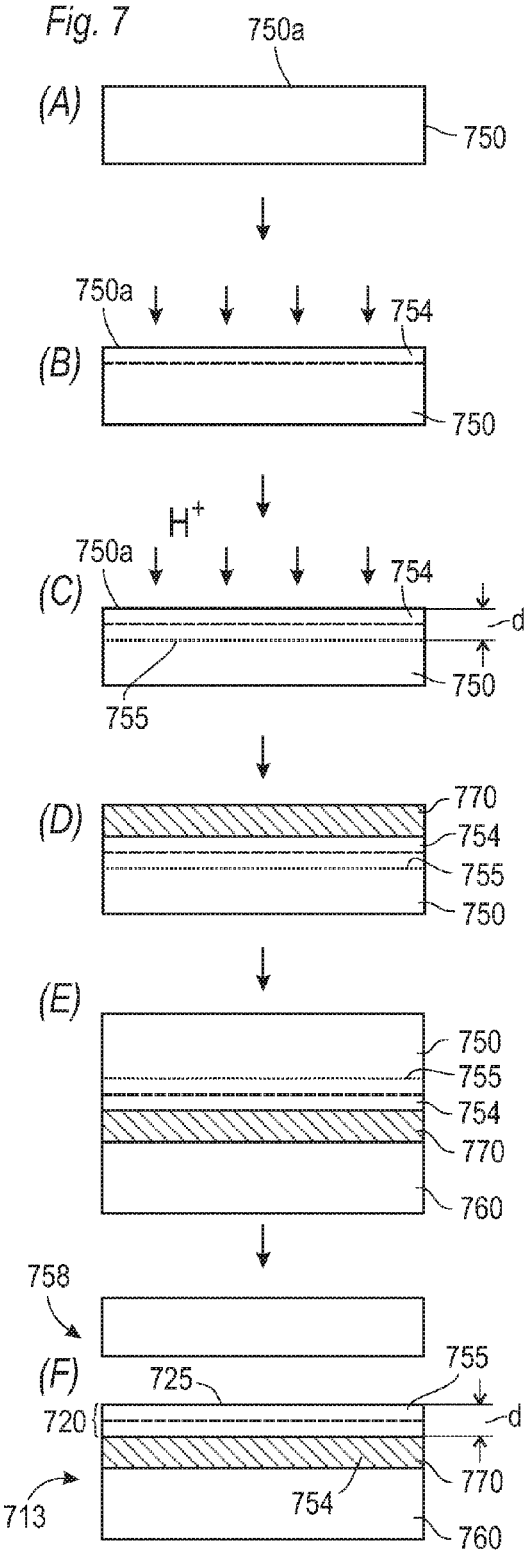

METHOD FOR MANUFACTURING A COMPOSITE WAFER HAVING A GRAPHITE CORE, AND COMPOSITE WAFER HAVING A GRAPHITE CORE

RELATED APPLICATION

The present application is a continuation of U.S. application Ser. No. 14/340,186 filed on Jul. 24, 2014 now U.S. Pat. No. 9,224,633, which is a divisional of previously filed U.S. application Ser. No. 13/206,029 filed on Aug. 9, 2011 (now U.S. Pat. No 8,822,306), which is a continuation-in-part of previously-filed U.S. application Ser. No. 12/894,344 filed on Sep. 30, 2010 (now U.S. Pat. No 8,404,562). The contents of each aforementioned application are incorporated herein by reference in their entireties.

FIELD OF THE INVENTION

Embodiments described herein relate to composite wafers having a graphite core or layer, and embodiments of methods for manufacturing composite wafers having a graphite carrier. Some embodiments relate to composite wafers having a graphite core or layer and a monocrystalline semiconductor layer. Further embodiments pertain to methods for manufacturing a plurality of semiconductor devices.

BACKGROUND

Semiconductor wafers such as silicon wafers having different thicknesses, which are sufficiently mechanically stable for handling, are used for manufacturing of semiconductor devices and integrated circuits. In most cases, comparably thick wafers are needed mainly for mechanical reasons during manufacturing but not for the final devices.

For many applications, for example electronic components such as fast-switching CMOS circuits, parasitic electrical coupling of the individual devices of the circuit to the large semiconductor volume of the wafer may result in unwanted coupling between individual devices and can limit the switching speed. Therefore, silicon-on-insulator (SOI) wafers are often employed. Such wafers include a buried oxide layer which electrically insulates the silicon layer used for forming the devices from the remaining semiconductor substrate. However, SOI-wafers are comparably expensive.

On the other hand, thin monocrystalline semiconductor wafers are desired for many applications such as devices for chip cards or devices where the current path goes from the top surface to the bottom surface. For such thin wafers additional carriers are needed for mechanical reasons during processing. Although the additional carriers improve the mechanical stability, additional costs incur. Furthermore, the carriers often tolerate only moderate processing conditions to which the semiconductor wafers are subjected and therefore limit their application.

For example carriers such a glass carriers glued to semiconductor wafers are often limited to temperatures below 350° C. due to the limited thermal stability of the adhesive. Glass carriers are also prone to breaking so that care must be taken during low pressure and vacuum processes. On the other hand, expensive SOI carrier system can withstand high temperatures but their manufacturing, particularly the bonding processes of partially or completely processed wafers are technologically difficult.

SUMMARY

According to one or more embodiments, a method for manufacturing a composite wafer includes providing a carrier wafer having a graphite layer; providing a monocrystalline semiconductor wafer having a first side and a second side; forming a bonding layer on at least one of the first side of the semiconductor wafer and the graphite layer of the carrier wafer, the bonding layer having a material selected from the group consisting of a metal, metal carbide, metal silicide, carbon powder, pitch, graphite, alumina glass, silica glass, and a mixture of alumina and silica glass; joining the monocrystalline semiconductor wafer with the graphite layer of the carrier wafer through the bonding layer; and subjecting the carrier wafer, the monocrystalline semiconductor wafer and the bonding layer to a thermal treatment to form an electrically conductive bond between the carrier wafer and the monocrystalline semiconductor wafer.

According to one or more embodiments, a method for manufacturing a composite wafer includes providing a first substrate; providing a second substrate having a graphite layer; forming a carbon layer having at least one of mesophase carbon, pitch and a mixture thereof on at least one of the first substrate and the graphite layer of the second substrate; joining the first substrate with the second substrate through the carbon layer; and subjecting the carbon layer, the first substrate and the second substrate to a thermal treatment to form a stable bond between the first substrate and the second substrate.

According to one or more embodiments, a method for manufacturing a composite wafer includes providing a carrier wafer having a graphite layer; providing a monocrystalline semiconductor wafer having a first side and a second side opposite to the first side; forming at least one structure on or at the first side of the monocrystalline semiconductor wafer, the structure being selected from the group consisting of metallisation layer and doping region; and bonding the monocrystalline semiconductor wafer at its first side to the graphite layer of the carrier wafer.

According to one or more embodiments, the carrier wafer having the graphite layer or the second substrate having the graphite layer includes one of a carrier substrate having a graphite layer, a carrier substrate having a graphite core, and a graphite carrier consisting essentially of graphite.

According to one or more embodiments, the graphite can be one of turbostratic graphite, pyrolytic graphite, isostatically pressed graphite, and mixtures thereof.

According to one or more embodiments, a method for manufacturing a composite wafer is provided. The method includes providing a monocrystalline semiconductor wafer having a first side and a second side arranged opposite the first side; depositing a moulding composition including at least one of carbon powder and pitch on the second side of the semiconductor wafer; and annealing the deposited moulding composition to form a graphite carrier attached to the semiconductor wafer. According to an embodiment, the moulding composition includes, in addition to or alternative, hydrocarbons such as aromatic hydrocarbons forming a past-like or flowable polymer composition.

According to one or more embodiments, a method for manufacturing a composite wafer is provided. The method includes providing a carrier wafer having a graphite core and a protective structure encapsulating the graphite core; and bonding a monocrystalline semiconductor substrate to the carrier wafer. According to one or more embodiments, the protective structure includes a barrier material which has oxygen-diffusion and/or hydrogen-diffusion barrier properties sufficient to prevent oxygen and/or hydrogen diffusion during processing in oxygen containing atmospheres. The protective structure can e.g. be a silicon layer. The protective structure may be different at the location of the bond with respect to the remaining parts of the carrier wafer. For example, the protective structure may be thinned, partially removed or partially replaced by another material.

According to one or more embodiments, a method for manufacturing a composite wafer is provided. The method includes providing a monocrystalline semiconductor wafer having a first side and a second side arranged opposite to the first side; implanting gas ions (e.g. protons) into the second side of the monocrystalline semiconductor wafer to form a delamination layer at a predefined depth in the monocrystalline semiconductor wafer; depositing a moulding composition including at least one of carbon powder and pitch on the second side of the monocrystalline semiconductor substrate at relatively low temperatures (e.g. T<400° C. or better<100° C.); and subjecting the monocrystalline semiconductor wafer and the moulding composition to at least one heat treatment to form a graphite carrier attached to the second side of the semiconductor wafer and split the monocrystalline semiconductor wafer along the delamination layer. According to one or more embodiments, the delamination layer can be formed by a micro-bubble layer or microporous layer. Optionally, an epitaxial layer of the semiconductor material with a well-defined thickness can be deposited on the surface of the monocrystalline semiconductor material.

According to one or more embodiments, a method for manufacturing a plurality of semiconductor devices is provided. The method includes providing a composite wafer having a graphite carrier and a monocrystalline semiconductor layer attached to the graphite carrier; processing the monocrystalline semiconductor layer to form a plurality of semiconductor devices; and dicing the processed monocrystalline semiconductor layer to form a plurality of separated semiconductor devices.

According to an embodiment, further includes removing the graphite carrier from the processed monocrystalline semiconductor layer before dicing.

According to an embodiment, further includes removing the graphite carrier from the processed monocrystalline semiconductor layer after dicing.

According to an embodiment, providing a composite wafer includes providing a semiconductor substrate having a first side and a second side arranged opposite to the first side; depositing a moulding composition having at least one of carbon powder and pitch on the second side of the semiconductor substrate; and annealing the deposited moulding composition to form a graphite carrier attached to the semiconductor substrate. According to an embodiment, the semiconductor substrate can be a polysilicon semiconductor substrate or a monocrystalline semiconductor substrate, According to one or more embodiments, a composite wafer is provided. The composite wafer includes a carrier substrate having a graphite core, and a monocrystalline semiconductor substrate or layer selected from silicon carbide and silicon attached to the carrier substrate.

According to one or more embodiments, a composite wafer is provided. The composite wafer includes a carrier substrate having a graphite core and a protective structure encapsulating the graphite core, and a monocrystalline semiconductor layer or substrate attached to the carrier substrate.

According to one or more embodiments, the carrier substrate includes at least one of turbostratic graphite, amorphous graphite, and isostatically pressed graphite. According to one or more embodiments, the carrier substrate further includes a semiconductor rim or edge structure laterally surrounding the graphite core. Rim structure (edge structure) can be a part of the protective structure. According to one or more embodiments, the carrier substrate further includes a semiconductor wafer having a recess, wherein the graphite core is disposed in the recess.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 6 illustrates processes of a method for manufacturing a composite wafer according to an embodiment.

FIG. 7 illustrates processes of a method for manufacturing a composite wafer according to an embodiment.

DETAILED DESCRIPTION

Figure 1A:
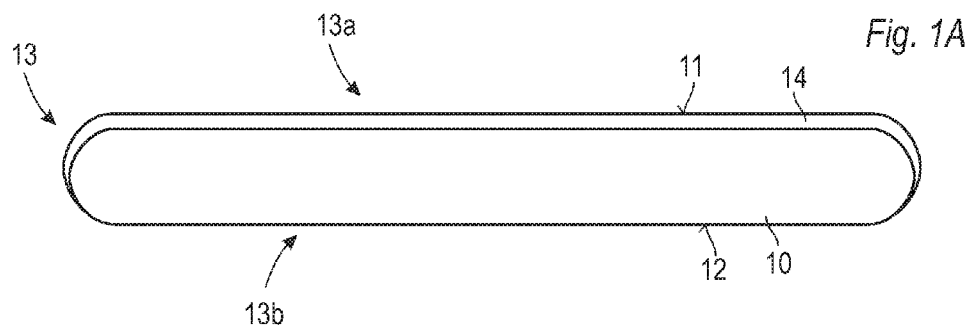
FIGS. 1A to 1J illustrate processes of a method for manufacturing a composite wafer according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Specific embodiments described herein pertain to, without being limited thereto, composite wafers having a graphite core and particularly to composite wafers having a graphite core comprised of turbostratic or amorphous or isostatically pressed graphite.

With reference to FIGS. 1A to 1J, a first embodiment of a method for manufacturing a composite wafer 13 is described. Briefly, a monocrystalline semiconductor wafer 10 having a first side or first surface 11 and a second side or second surface 12 arranged opposite to the first side 11 is provided. Semiconductor wafer 10 can also be a polysilicon wafer. Composite wafer 13 also includes a first side 13a and a second side 13b. First side 13a is orientated in the Figures to the top while second side 13b is orientated to the bottom. The terms first side 13a and second side 13b of composite wafer 13 does not necessarily mean a specific surface of a given layer unless otherwise stated but generally describe the respective sides of the composite wafer 13 irrespective of the actual material or layer disposed on one of the sides.

The semiconductor wafer 10 can be made of any semiconductor material suitable for manufacturing semiconductor devices. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above-mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

In one of the subsequent processes, a moulding composition 35 including at least one of carbon powder and pitch is deposited on the second side 13b of the composite wafer 13, which can be formed by second side 12 of semiconductor wafer 10, by any suitable process such as, for example, injection moulding, compression moulding, powder moulding or pressing using a die to bring a quantity of the moulding composition 35 under a given pressure onto the second side 12 of the semiconductor substrate 10, or any other process capable of covering the second side with a paste-like or viscous layer. Second side 13b of the composite 13 can be formed by the exposed semiconductor material of semiconductor wafer 10 or can include one or more layers covering the semiconductor material. In one of the subsequent processes, the moulding composition 35 is annealed to form a graphite carrier or core 36 attached to the semiconductor wafer 10. Alternatively, a preformed graphite core made of turbostratic or amorphous or isostatically pressed graphite can be fixed on the second side 12 with a bonding layer.

Annealing can include, according to an embodiment, annealing in a first temperature range and subsequently in a second temperature range which is different to the first temperature range. Second temperature range can encompass temperatures higher than the first temperature range. For example, first temperature range can be from about room temperature to about 600° C. Second temperature range can be, for example, from about 500° C. to about 1000° C. or even higher. The first annealing process can be used for removing additives and auxiliary components, such as binders, from the moulding composition. The auxiliary components or additives are thermally driven out of the moulding composition or are thermally decomposed to form volatile compounds. The second annealing process can be used to convert the moulding composition into a graphite material.

According to an embodiment, three annealing processes performed at different temperatures can be used. According to an embodiment, the annealing processes can be combined into a single process having a given temperature profile.

The one or more annealing processes are suitably selected and configured to form a graphite core which is mainly comprised of turbostratic or amorphous or isostatically pressed graphite. Such graphite improves the mechanical stability of the semiconductor wafer. Furthermore, graphite has a thermal expansion coefficient similar to that of SiC which makes graphite a most promising carrier material for SiC. Graphite, however, is also suitable for other semiconductor materials such as silicon.

The final composite wafer 13 includes a carrier substrate or wafer and a device layer attached thereto. The carrier substrate is formed at least by the graphite core 36 and, according to an embodiment, by the monocrystalline rim or edge structure 15 (in the following rim structure) while the device layer is formed by monocrystalline semiconductor layer 20. The carrier substrate can also include further layers such as a buried insulating layer and at least one protective layer for protecting the graphite core.

According to an embodiment, the semiconductor wafer 10 can be a CZ-wafer manufactured by a Czochralski process or a FZ-wafer manufactured by a float-zone process. For the purpose of illustration only, semiconductor wafer 10 is a Si-wafer in this embodiment. Semiconductor wafer 10 can include a highly p-doped layer 14 formed at its first side or surface 11 as shown in FIG. 1A. P-doped layer 14 forms an etch stop layer in one of the subsequent processes. Highly p-doped layer 14 can be formed, for example, by implantation or by out-diffusion from a BSG (boron silicate glass) layer deposited on the first side 11 of the semiconductor wafer 10. By appropriately selecting the duration and temperature of the out-diffusion step, the layer thickness of the p-doped layer 14 can be adjusted.

Figure 1B:
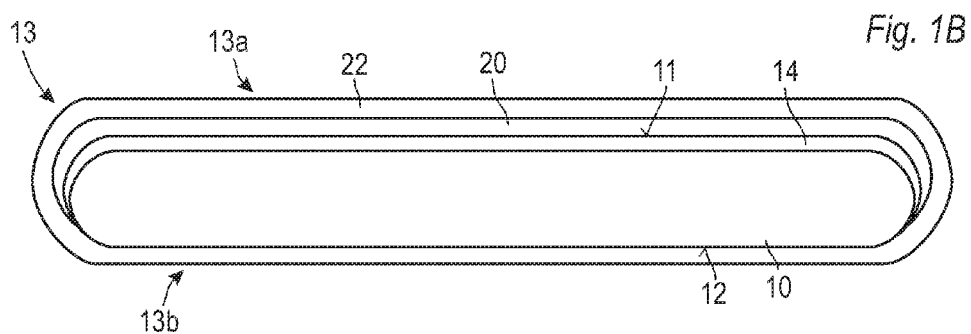

According to an embodiment, a semiconductor layer 20 is epitaxially formed on the first side 11 of the semiconductor wafer 10 as shown in FIG. 1B. If a highly doped layer 14 has been formed in advanced, semiconductor layer 20 is deposited on the highly doped layer 14. Semiconductor layer 20 will later form the device layer, i.e. the substrate in which the semiconductor devices or circuits are integrated. Semiconductor layer 20 can therefore be also referred to as device layer.

Forming an epitaxial semiconductor layer 20 on the semiconductor wafer 10 allows tailoring of the doping concentration to meet specific needs. This also facilitates variation of the doping concentration within semiconductor layer 20.

According to an embodiment, a first protective layer 22 can be provided on the first side 11 of semiconductor wafer 10 or on semiconductor layer 20 if formed as shown in FIG. 1B. First protective layer 22 can be a passivation layer against etching in one of the subsequent processes. For this purpose, any suitable material which allows a selective etching of the material of semiconductor wafer 10 relative to first protective layer 22 can be used. Examples are polysilicon, silicon nitride or silicon oxide. Another example is a CVD graphite layer which can be formed by pyrolysis using volatile hydrocarbons such as alkene (methane, ethane etc.). A further example is a layer of amorphous carbon, so-called diamond-like carbon (DLC), which can be formed from hydrocarbons using PE-CVD (physically enhanced chemical vapour deposition).

First protective layer 22 can also be a foil covering the first side 13a of composite wafer 13, i.e. on the semiconductor layer 20. A foil is a very cost-effective solution and sufficient when first protective layer 22 shall prevent debris or other contaminations from reaching the semiconductor layer 20 during subsequent formation of the graphite carrier or core 36. A foil can also be removed. The resulting structure 13 forming a preliminary stage of the composite wafer 13 is illustrated in FIG. 1B.

Figure 1C:
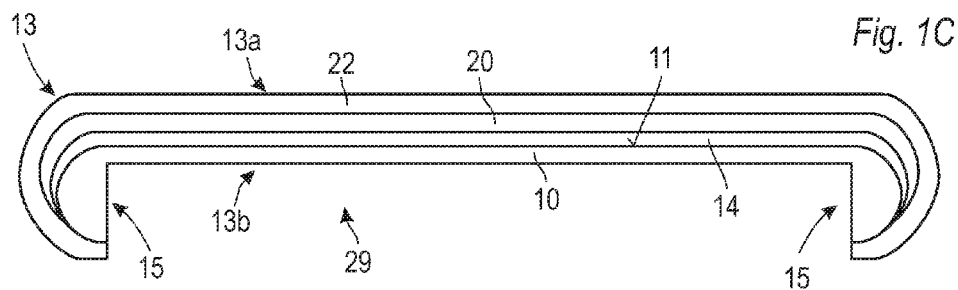

In a further process as illustrated in FIG. 1C, material of the semiconductor wafer 10 is removed at its second side 12 to reduce the thickness of the semiconductor wafer 10 locally. For example, grinding can be used to remove material up to a given thickness. In an embodiment, the grinding stops before the highly doped layer 14 is exposed. In a further process, the semiconductor material is further removed by etching the semiconductor material of the semiconductor wafer 10 selectively to the highly p-doped layer 14. For example, wet-chemical etching using a basic solution can be used. The etching stops when reaching highly p-doped layer 14 so that this layer is exposed at the second side 13b of the composite wafer 13.

According to an embodiment, grinding can be performed such that a rim structure 15 of the semiconductor wafer 10 remains. The rim structure 15 forms a ring of monocrystalline semiconductor material integral with the remaining material of composite wafer 13 and mechanically supports the thinned wafer structure. To form the rim structure 15, grinding is performed only in the central section of the semiconductor wafer 10 to form a recess 29 leaving a small peripheral region ungrinded. Forming a rim structure 15, however, is only optional and not required.

Figure 1D:
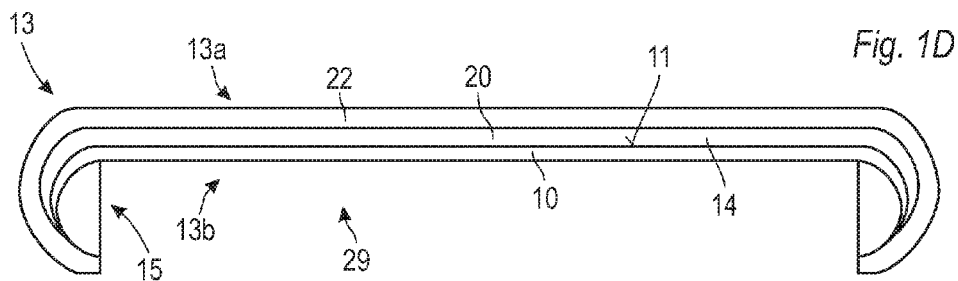

FIG. 1C illustrates the resulting structure of the composite wafer 13 after grinding and FIG. 1D after additional etching. The rim structure 15 or ring 15 has thickness in vertical direction, i.e. in the direction perpendicular to the first and second surfaces 11, 12 of the semiconductor wafer 10, which substantially equals the initial thickness of the semiconductor wafer 10. Typically, the initial thickness of the semiconductor wafer 10 is about few hundred micrometers. The target thickness of the semiconductor wafer 10 after grinding and etching is significantly less than the initial thickness and can be in a range of few ten micrometers depending on the thickness of the finally processed device which has to be chosen so that the desired blocking capability of the device is guaranteed. Since p-doped layer 14 will be removed later in most cases, the actual thickness of the p-doped layer 14 is not important as long as it has a sufficient thickness to serve reliably as an etch stop layer. The final thickness of the device is determined by the thickness of the semiconductor layer 20, which can be, for example, 140µm or less. This thickness is sufficient for many applications including vertical power semiconductor devices having a front-side metallization and a back-side metallization.

Semiconductor wafer 10 is used in the embodiment illustrated in FIGS. 1A to 1J as an "intermediate" carrier for providing a substrate onto which the epitaxial semiconductor layer 20 can be deposited and for building up the composite wafer 13.

Alternatively, if no epitaxial semiconductor layer 20 is formed, the semiconductor wafer 10 can be thinned to a given target thickness so that a thin "membrane" of the semiconductor wafer 10 remains.

Figure 1E:
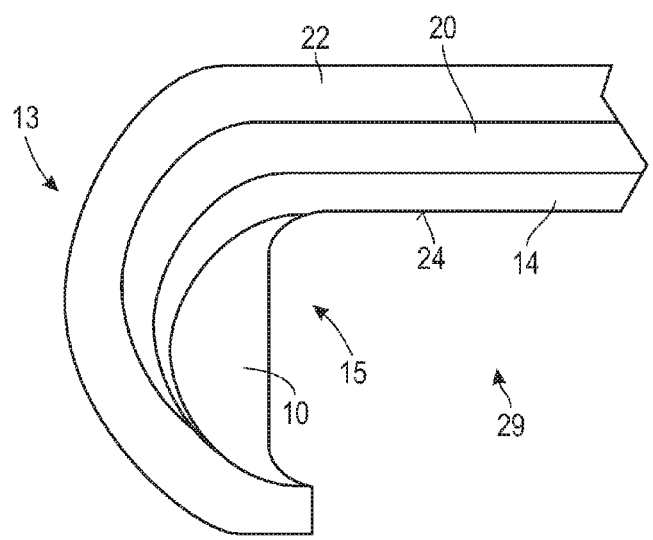

FIG. 1E shows an enlarged section of composite wafer 13 after etching to illustrate the isotropic etch characteristics of the wet-chemical etching. During wet-chemical etching, the ring structure 15 is also partially etched resulting in a partial under-etching as illustrated in FIG. 1E. This is, however, not critical since the total thickness of the semiconductor material to be removed by the wet-chemical etching is rather small, so that a short etching is needed only. Typically, the thickness of the semiconductor material which remains after grinding is in a range of about few µm, for example 10µm so that isotopic etching will also laterally remove material in a similar range. If desired, the ring structure 15 can be formed thicker to compensate for etch removal.

Figure 1F:
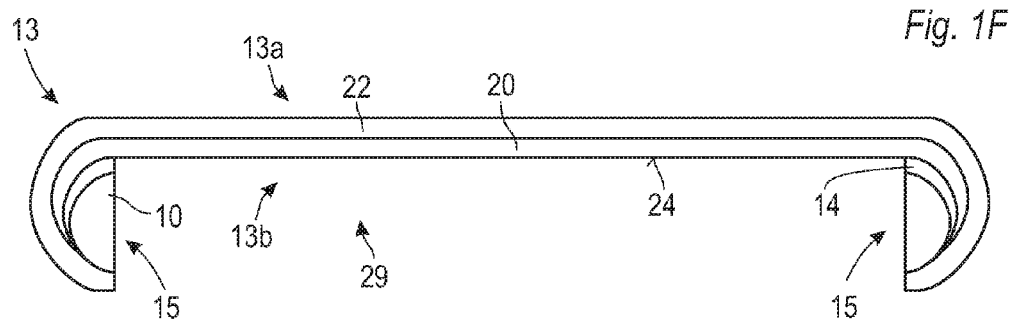

In a further process as illustrated in FIG. 1F, the highly-doped layer 14 exposed in recess 29 is isotropically etched and removed to expose a back-side 24 of the semiconductor layer 20. Isotropic wet-chemical etching can be used to remove the highly-doped layer 14. After this process, back-side implantation processes and/or annealing processes needed for integrating the devices or circuits can be carried out.

P-doped layer 14 has been used above as etch stop layer. Alternative to this process, other processes can be used to define the final or target thickness of the "device layer". For example, a SiGe-layer can be used as etch stop layer onto which the device layer is formed. Another option is the use of a pn-junction as etch stop. For example, if an n-doped device layer is desired, an n-doped semiconductor layer 20 can be epitaxially deposited onto a weakly p-doped semiconductor wafer 10. The pn-junction formed between the n-doped semiconductor layer 20 and the p-doped semiconductor is then reversely biased against the semiconductor wafer 10 or the etch solution and can therefore function as etch stop once the etching has reached the depletion zone of the pn-junction. The remaining p-doped semiconductor material is finally removed by a short isotropic etch process.

Figure 1G:
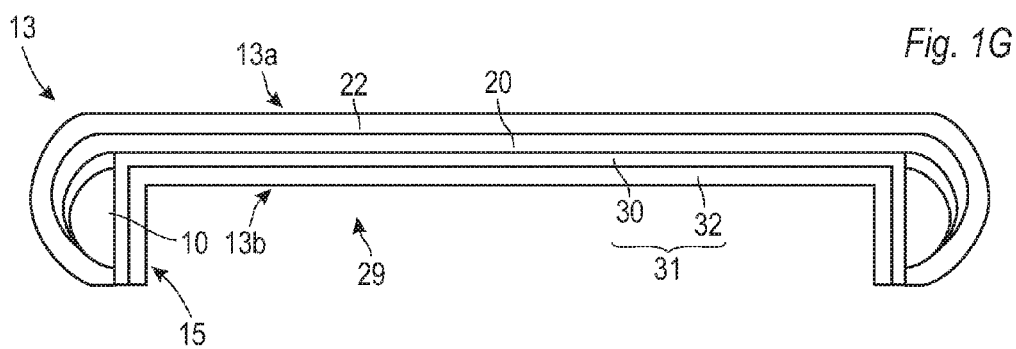

In a further process, an intermediate layer 31 is formed in recess 29 and particularly on the exposed back-side 24 of semiconductor substrate layer 20. Intermediate layer 31 can be a single layer or a layer stack. In the embodiment illustrated here, intermediate layer 31 is formed by an insulating layer 30 and an adhesive layer 32 used to improve adhesion and contact to the subsequently deposited graphite material. Insulating layer 30 can be, for example, a thermal oxide layer 30 or an aluminium nitride layer 30. Alternatively, a conductive layer can be used instead of an insulating layer or insulating layer 30 can even be omitted. Adhesive layer 32 can be, for example, a polysilicon layer. The resulting structure is illustrated in FIG. 1G.

Figure 1H:
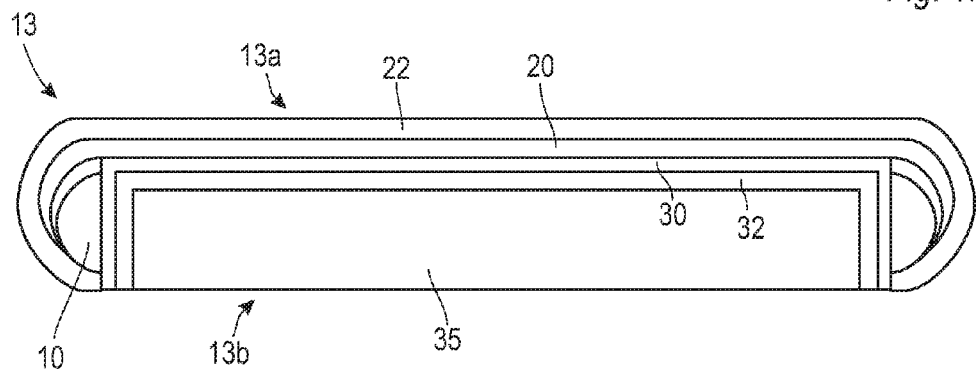

In a further process, as illustrated in FIG. 1H, recess 29 is filled with a moulding composition 35. The moulding composition 35 includes at least one of carbon powder and long-chain hydrocarbons such as pitch. A binder can be added to obtain a plastic or flowable mass. The moulding composition 35 fills recess 29 and is deposited by an injection moulding process for example. Injection moulding is a cost efficient process for forming pieces and can be used here to fill recess 29. Another suitable process is bringing a given quantity of the moulding composition 35 into the recess and then pressing the composition to reliably fill the recess. This process is sometimes referred to as compression moulding.

The consistence of moulding composition 35 is suitably selected to facilitate the filling of recess 29. For example, moulding composition can be a soft composition including mesophase carbon. Mesophase carbon can be described, without being limited to, as a state of pitch in an intermediate state between solid and liquid phase. Pitch can also be in a mesophase state and can include a complex blend or mixture of hydrocarbons such as aromatic hydrocarbons.

After filling recess 29, moulding composition 35 is annealed to form a graphite carrier or core 36 composed of turbostratic or amorphous graphite. Annealing can include a first annealing step for removing the binder or other additives and a second annealing step typically at a higher temperature than the first annealing step for sintering the carbon material such as powder or high-molecular weight hydrocarbons included in the moulding composition. Suitable temperature ranges for the annealing steps have been described above. In an embodiment, a single annealing step with a given temperature profile such as a slowly increasing temperature ramp can also be employed.

If needed, excess graphite material can be subsequently removed by mechanical grinding or any other suitable process. First protective layer 22, which has also been formed on the second side of semiconductor wafer 10 and which still exists on the rim structure 15 can be used as stop layer during grinding.

The thus formed composite wafer 13 has a thickness which exceeds the initial thickness of semiconductor wafer 10 by the thickness of the semiconductor layer 20 and the first protective layer 22. Rim structure 15, which can also be referred to as "reinforcing structure" or "reinforcing ring", laterally protects graphite core 36 and prevents that the lateral edge of graphite core 36 is damaged when handling the composite wafer 13. Since rim structure 15 is composed of monocrystalline semiconductor material of commonly used wafers, no modifications on the handling and processing tools are needed. Furthermore, the composite wafer 13 can be provided with the typical rounded edges used by commonly known wafers. This also facilitates handling of the composite wafer 13.

Formation of the graphite carrier or core 36 as described herein is cost-efficient and a fast procedure. Moreover, virtually any shape of recess 29 can be filled with the moulding composition which also facilitates formation of the graphite carrier.

Figure 1I:
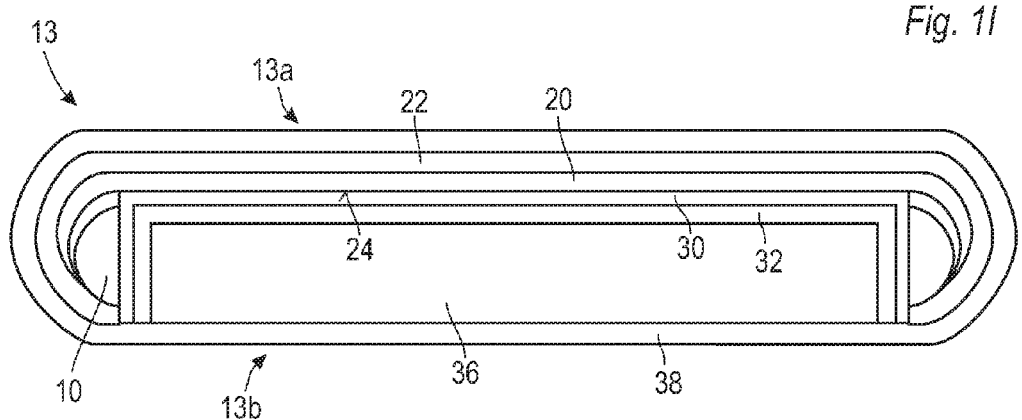

To protect the graphite core 36 against attack of oxygen and hydrogen during processes carried out during manufacturing of the semiconductor devices or circuits, a second protective layer 38 can be formed on the entire surface of the composite wafer 13 or only on the exposed surface portions of graphite core 36. Second protective layer 38 shall act as oxygen and hydrogen diffusion barrier to prevent that the carbon reacts, for example, to $CO_2$ in an oxygen-containing atmosphere or to volatile hydrocarbons at high temperatures. Suitable diffusion barrier materials are, for example, silicon, silicon nitride, silicon dioxide, silicon carbide and polysilicon. Rim structure 15 also forms a barrier. Second protective layer 38 and rim structure 15 form together a protective structure encapsulating graphite core 36. FIG. 1I illustrates the composite wafer 13 with a second protective layer 38 covering the complete surface of the composite wafer 13.

Figure 1J:
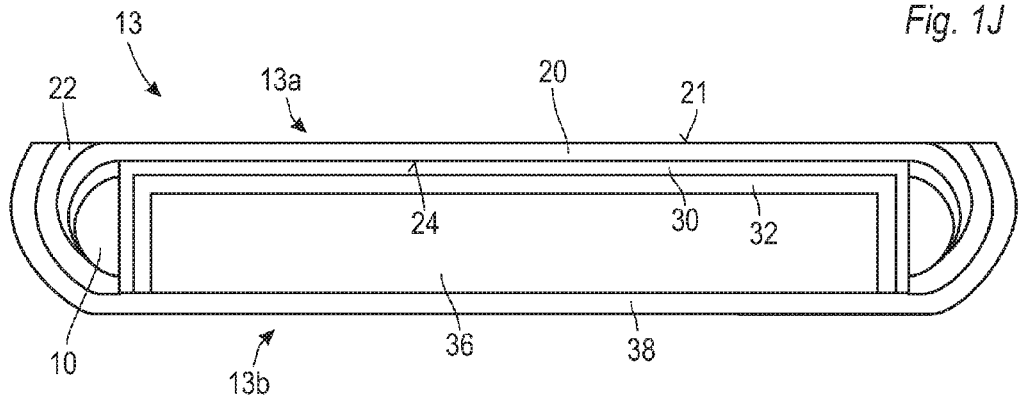

In a further process, as illustrated in FIG. 1J, first protective layer 22 and second protective layer 38 are removed at the first side 13a of composite wafer 13 to expose semiconductor layer 20. Removal can include, without being limited thereto, plasma-etching, wet-chemical etching and chemical-mechanical etching. The resulting composite wafer 13 is ready to be used as wafer for integrating semiconductor devices or circuits.

After integrating device structures into the first side 13a of the composite wafer 13, i.e. into semiconductor layer 20, the graphite core 36 can be removed or can be left to be included into the final device. For example, if a device structure similar to a SOI-structure such as CMOS-SOI is desired, graphite core 36 remains in place and is not removed. In this case, graphite core 36 forms the carrier structure of the final device.

If the back-side 24 of the semiconductor layer 20 (device layer) needs to be processed, for example for vertical power devices having a back-side metallization, graphite core 36 can be removed by grinding, etching, burning in an oxygen-containing atmosphere or any suitable combination thereof. Optional intermediate layer 31 can also be removed, for example by a wet-chemical etching process, leading to exposure of the back-side of the semiconductor layer 20. In further processes, any desired process to finalize the semiconductor devices or circuits can be performed including implantation and formation of back-side metallization.

Optional intermediate layer 31 can be omitted when devices are desired with a vertical current flow, i.e. the current flows from the front-side to the back-side of the device. Composite wafer 13 includes than a graphite core 36 which is in electrical contact with semiconductor layer 20. Alternatively, only a conductive intermediate layer can be formed. The material characteristics of graphite can be selected to have an electrical conductivity sufficient to serve as back-side electrode or contact layer. This also facilitates handling of the final devices since the total substrate thickness of the devices is increased.

According to an embodiment, the composite wafer 13 having the graphite carrier or core 36 and the monocrystalline semiconductor substrate or layer 20 attached to the graphite carrier or core 36 is used for processing or integrating a plurality of semiconductor devices into the monocrystalline semiconductor substrate or layer 20. After partial or complete integration, the graphite core 36 is removed from the processed monocrystalline semiconductor layer, for example in an oxygen containing plasma. In a further process, the monocrystalline semiconductor substrate or layer 20 is diced, for example by sawing or scribing, to form a plurality of separated semiconductor devices.

According to an embodiment, as described herein, a graphite carrier is used and constitutes a cost efficient alternative to a common SOI substrate which requires an expensive monocrystalline semiconductor material. The graphite material can be adjusted with respect to its coefficient of thermal expansion to be similar to that of the semiconductor material to reduce warping of the composite wafer.

Figure 2A:
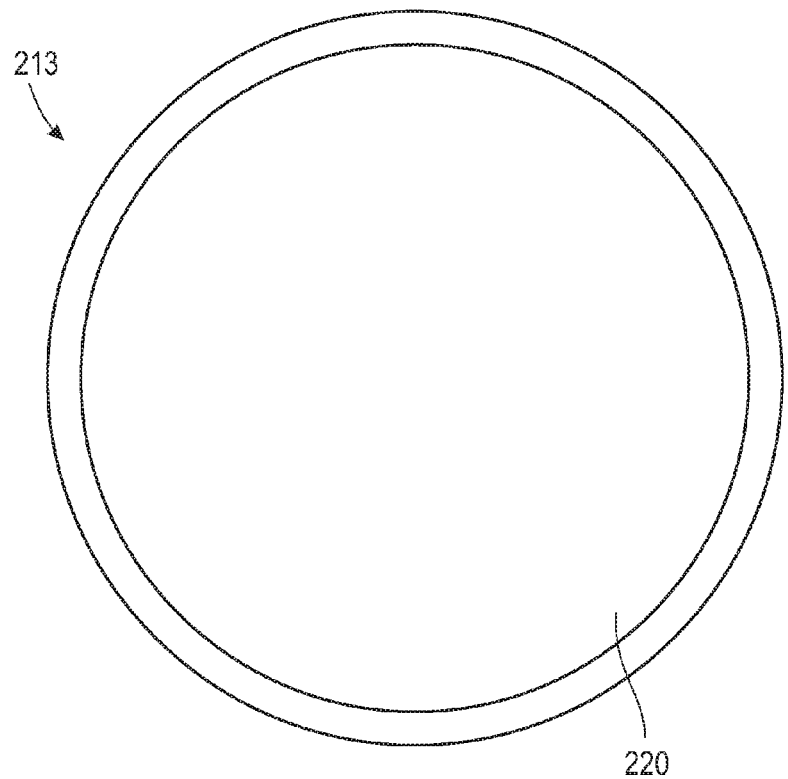
FIGS. 2A to 2B illustrate processes of a method for manufacturing a composite wafer according to an embodiment.
Figure 2B:
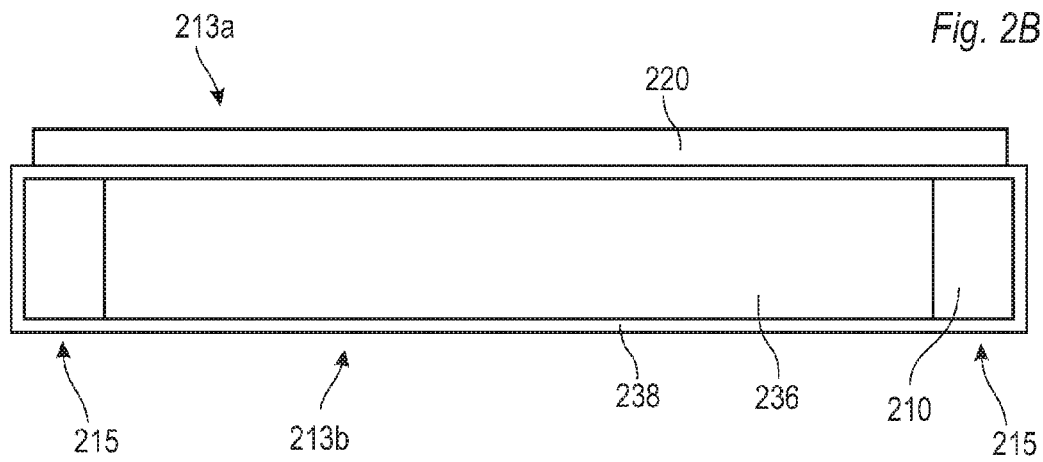

FIGS. 2A and 2B illustrate a further embodiment with a reduced usage of monocrystalline material. A composite wafer 213 is formed on the basis of a polycrystalline semiconductor wafer such as a polysilicon wafer 210. Composite wafer 213 can also be formed on the basis of a monocrystalline semiconductor wafer. FIG. 2A illustrates a plan view on the composite wafer 213 while FIG. 2B illustrates a cross sectional view of composite wafer 213.

Similar as described above, a recess is formed in the polycrystalline wafer 210 at the second side 213b, filled with a moulding composition by any one of the processes described above, and then subjected to an annealing process or processes to form a graphite core 236. In a further process, a protective layer 238 is formed on the entire surface of the composite wafer 213. For example, $Si_3N_4$ can be used as material for protective layer 238. Composite wafer 213 includes, as above, a rim structure 215 which laterally protects the graphite core 236. Rim structure 215 is composed of polycrystalline material. Protective layer 238 and rim structure 215 form a protective structure encapsulating graphite core 236.

On the first side 213a of the composite wafer 213 there is disposed a monocrystalline semiconductor layer 220 forming the device layer in this embodiment. Semiconductor layer 220 can be attached to the graphite core 236 by bonding for example. It would also be possible to bond the polycrystalline wafer 210 to the semiconductor layer 220 and form the recess subsequently thereto. Hence, the carrier substrate formed by graphite core 236, rim structure 215 and protective layer 238 can be formed in advance and then bonded to the semiconductor layer 220 or, alternatively, the carrier substrate can be formed after bonding the polycrystalline wafer 210 to the semiconductor layer 220.

The final composite wafer 213 includes a carrier substrate or wafer and a device layer attached thereto. The carrier substrate is formed at least by graphite core 236 and polycrystalline rim structure 215 while the device layer is formed by monocrystalline semiconductor layer 220. The carrier substrate can also include further layers such as a buried insulating layer and at least one protective layer 238 covering at least the second side 213b of the graphite core 236 for protecting the graphite core 236.

Figure 3:
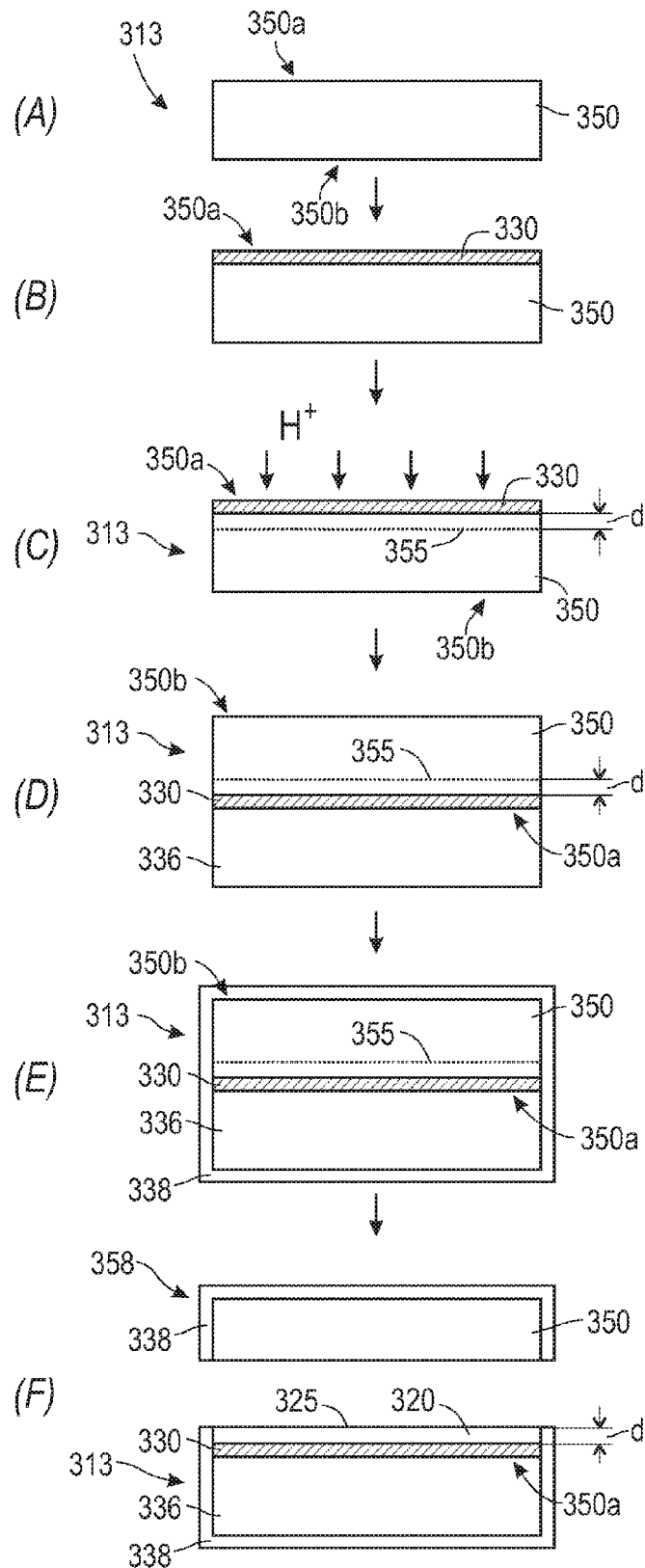
FIG. 3 illustrates processes of a method for manufacturing a composite wafer according to an embodiment.
Figure 4:
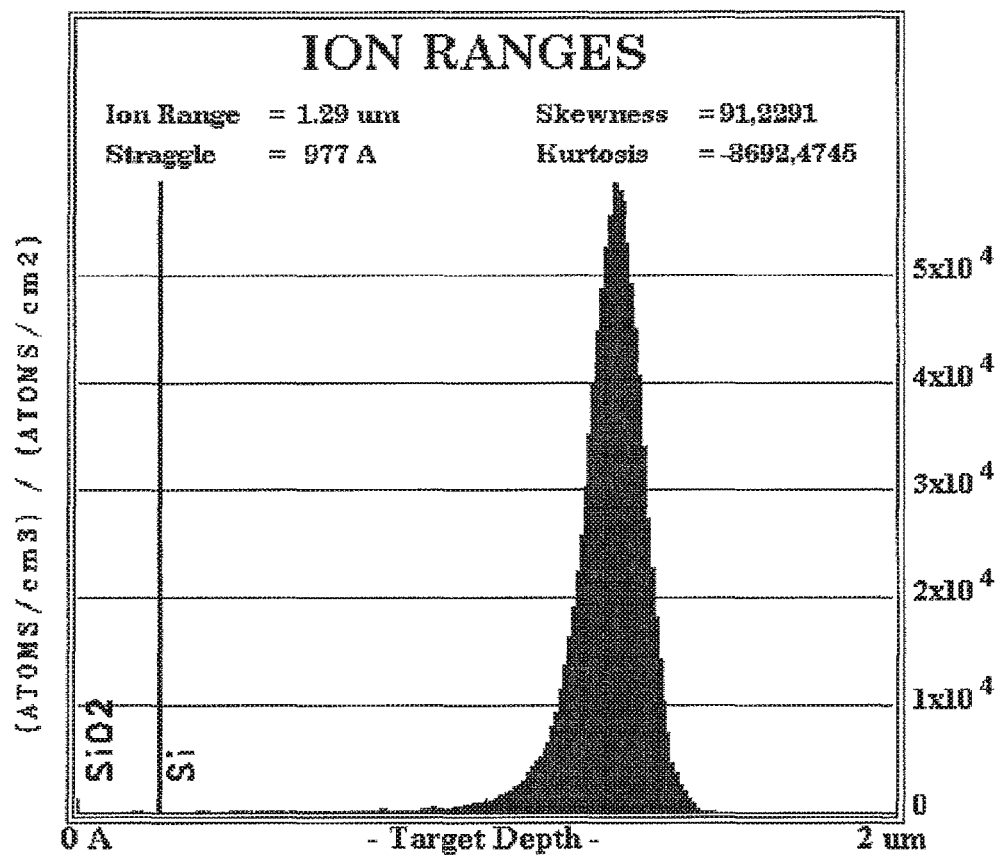
FIG. 4 illustrates an implantation profile of protons used during manufacturing of a composite wafer according to an embodiment.

With respect to FIGS. 3 and 4, a further embodiment of manufacturing a composite wafer 313 is described which can be combined with any of the other embodiments disclosed herein. In process (A), a monocrystalline semiconductor wafer 350 is provided having a first side 350a and a second side 350b arranged opposite to the first sides 350a. Semiconductor wafer 350 can be of any suitable semiconductor material as described above. For many applications, silicon or silicon carbide is used. In process (B), a bonding layer 330, which later forms an intermediate layer or buried layer, is formed on the first side 350a of semiconductor wafer 350. Bonding layer 330 can be, for example, an insulating layer such as an oxide layer. For example, thermal oxidation can be used to form bonding layer 330. Furthermore, bonding layer 330 can also be deposited. Bonding layer 330 serves in subsequent processes as a layer facilitating bonding to a carrier substrate or wafer. The material of bonding layer 330 is therefore selected to provide a thermally stable layer. An example for an insulating bonding layer is silicon dioxide. An example for an electrically conductive bonding layer is polysilicon. If an insulating layer is not required the bonding layer is not absolutely necessary.

In a further process as illustrated in (C), gas ions such as protons are implanted into the first side 350a of semiconductor wafer 350 into a given depth. The implantation depth can be adjusted by selecting the implantation energy. The implantation depth defines the thickness d of the device layer as described further below.

The implantation of gas atoms or gas ions (e. g. protons), respectively, causes the formation of a delamination layer 355 which can be a micro-bubble layer or micro-porous layer along which the semiconductor wafer 350 is delaminated by a later process.

As illustrated in process (D), a graphite carrier or core 336 is formed on the first side 350a of semiconductor wafer 350. Semiconductor wafer 350 is turned in (D) upside-down so that the first side 350a is now the bottom side while the second side 350b is now the top side. Graphite carrier 336 can be formed as described above including bringing a moulding composition onto the first side 350a of semiconductor wafer 350. A mild annealing step can be performed to remove optional binders or any other auxiliary compounds. Alternatively, a preformed graphite carrier such as made of turbostratic graphite, pyrolytic graphite, or isostatically pressed graphite can be fixed on the semiconductor wafer with a bonding layer.

In a further process as illustrated in (E), a protective layer 338 is formed at least on exposed portions of graphite core 336. Protective layer 338 can also be formed on the entire surface of composite wafer 313 including on the second side 350b of semiconductor wafer 350. Protective layer 338 can be a single layer or a layer stack. Suitable materials for forming protective layer 338 are polysilicon, silicon nitride ($Si_3N_4$) or silicon dioxide ($SiO_2$) or silicon carbide. Protective layer 338 can be formed at comparably low temperatures to avoid thermal stress within delamination layer 355. Protective layer 338 protects the graphite core 336 and bonding layer 330 against mechanical and chemical stress which may occurs during subsequent processes including processes used for integrating semiconductor devices and circuits.

The thickness and material for protective layer 338 can be selected according to specific needs. For example, protective layer 338 should be configured to serve as oxygen and hydrogen diffusion barrier as described above.

As illustrated in (F), composite wafer 313 is subjected to a thermal treatment to delaminate the semiconductor wafer 350 along the delamination layer 355 which serves as a cleavage plane. The thermal treatment causes mechanical tensions which results in a separation along the delamination layer 355. A comparably thin semiconductor layer 320 remains bonded to the graphite core 336 through bonding layer 330. Semiconductor layer 320 has a thickness d which was defined by the implantation energy of the gas ions in process (C).

The delamination process leads to the formation of a part-wafer 358 which can be used again for manufacturing further composite wafers. This is very cost-efficient and is particularly of interest for SiC. Part-wafer 358 can be polished before reuse.

Composite wafer 313 includes the monocrystalline semiconductor layer 320 which remains attached to graphite core 336. Semiconductor layer 320, which was detached from semiconductor wafer 350 by the delamination process, includes a cleavage surface 325 which can be polished if desired.

According to an embodiment, an epitaxial layer (not shown) can be formed on the semiconductor layer 320 to tailor, for example, the doping concentration of the device layer. Epitaxial layer and semiconductor layer 320 form then together the device layer.

According to an embodiment, bonding layer 330 can be omitted or replaced by an electrically conductive layer such as a polysilicon layer to allow formation of devices having a vertical current path from the top side to the bottom side of the final devices.

According to an embodiment, instead of forming a delamination layer 355 for cutting the semiconductor wafer 350, semiconductor wafer 350 can be grinded, polished and/or etched to reduce its thickness and to form a semiconductor layer 320 having the desired thickness d.

As described above, a method for manufacturing a composite wafer is provided according to an embodiment. The method includes providing a monocrystalline semiconductor substrate including a first side and a second side arranged opposite to the first side; forming an insulating layer on the first side of the monocrystalline semiconductor substrate; depositing a moulding composition containing at least one of carbon powder, pitch, aromatic hydrocarbons, a binder, and a combination thereof on the insulating layer; and annealing the deposited moulding composition to form a graphite carrier attached to the semiconductor substrate.

According to an embodiment, gas ions are implanted into the first side of the monocrystalline semiconductor substrate to form a delamination layer such as a micro-bubble layer in a predefined depth after forming the insulating layer. The monocrystalline semiconductor is subjected to a heat treatment for cutting or splitting the monocrystalline semiconductor substrate along the delamination layer.

According to an embodiment, the splitting of the monocrystalline semiconductor wafer results in the formation of a monocrystalline semiconductor layer which remains attached to the graphite carrier, the monocrystalline semiconductor layer includes an exposed side. A further process includes forming an epitaxial semiconductor layer on the exposed side of the monocrystalline semiconductor layer.

According to an embodiment, the thickness of the monocrystalline semiconductor wafer can be reduced by removing semiconductor material at the first side of the monocrystalline semiconductor wafer to form a thin semiconductor layer serving as device layer.

According to an embodiment, the total thickness of bonding layer 330 and the desired thickness d of the semiconductor layer 320 should be about 1.3µm or less to reduce the implantation energy needed for implanting the gas ions, particularly when using protons. When restricting the total thickness to this range, proton implantation energy can be 150 keV or less. At this not very high implantation energy, the generation of strong X-ray radiation is comparably low which is beneficial for the equipment. When restricting the implantation energy to about 150 keV or less, no additional safety equipment is needed. Furthermore, restricting the implantation energy also reduces the energy impact into the semiconductor material and thus allows an increase of the implantation dose, i.e. beam current, to reduce the implantation duration. It is, however, also possible to use higher implantation energies if desired.

According to an embodiment, the total implantation depth with respect to the upper surface of the bonding layer 330 corresponds to the thickness of the bonding layer plus additional few tens nanometer or several tenths of micrometer for the comparably thin semiconductor layer 320. The bonding layer 330 can be, for example about 50 nm to about 500 nm thick. The thickness d of the semiconductor layer 320 can be in a range from about 10 nm to about 200µm. The semiconductor layer 320 can be comparably thin and even thinner than the desired final thickness for the device layer since an epitaxial layer can be formed subsequently to the splitting on the semiconductor layer 320 to reach the final thickness.

According to an embodiment, the gas ions are implanted into the first side 350a of the monocrystalline semiconductor wafer 350 using implantation energy of no more than 150 keV.

FIG. 4 shows an exemplary doping profile for protons implanted with energy of 150 keV perpendicular to the surface of a 200 nm thick $SiO_2$ disposed on the surface of a silicon wafer 350. Such an implantation results in the formation of a delamination layer in a depth of about 1.29 µm when measured from the top surface of the $SiO_2$ layer. At this depth, delamination occurs during the thermal treatment. By appropriately selecting the implantation energy, the location of the delamination layer 355 and hence the target thickness of the semiconductor layer 320 can be adjusted.

The delamination process as described herein is also attractive for power devices on the basis of SiC. Examples are diodes, J-FETs, IGBTs, MOSFETs, SiC-SOI devices etc. The process starts with providing a SiC wafer 350 and formation of an optional bonding layer which can be insulating or electrically conducting. After delamination, the SiC wafer 350 can be reused several times, wherein each time the wafer has been used its thickness is reduced by the amount corresponding to the thickness of semiconductor layer 320 which remains attached to the carrier substrate or wafer. After delamination, the surface of the SiC wafer 350 can be polished before reuse.

In case of SiC, protons are typically used for generating delamination layer 355. Alternatively, a combination of dopants can be used, for example protons and boron ions. The latter approach allows reduction of the needed implantation dose.

The carrier wafer having a graphite core can be formed by any of the above-described methods such as injection moulding or compression moulding directly on the SiC wafer 350, or can be manufactured in advance and then bonded to the SiC wafer as described further below. It is also possible to provide a crystalline or isostatically pressed graphite carrier substrate which is then bonded to the SiC wafer 350.

According to an embodiment, the surface of the SiC wafer 350 to which the graphite core is bonded or onto which the graphite is moulded, can be transformed into a carbon layer by a suitable thermal process. By so doing, the contact to the graphite material can be improved since the graphite material, either by moulding or bonding, is brought into direct contact with the carbon layer. This approach is particularly suitable for devices with a vertical current path since no buried insulating layer is formed.

According to an embodiment, it is furthermore possible to use a crystalline graphite carrier which is bonded to a semiconductor wafer which either undergoes the above described delamination procedures or back etching to form a thin semiconductor layer attached to the crystalline graphite carrier. Crystalline graphite has a particular lattice structure which exhibits an anisotropic heat conductivity which can be used to improve heat dissipation particularly in lateral direction. This reduces the likelihood of hot-spot generation within the final devices or reduces the maximum temperature of such hot-spots. Crystalline graphite is also comparably inexpensive.

Figure 5:
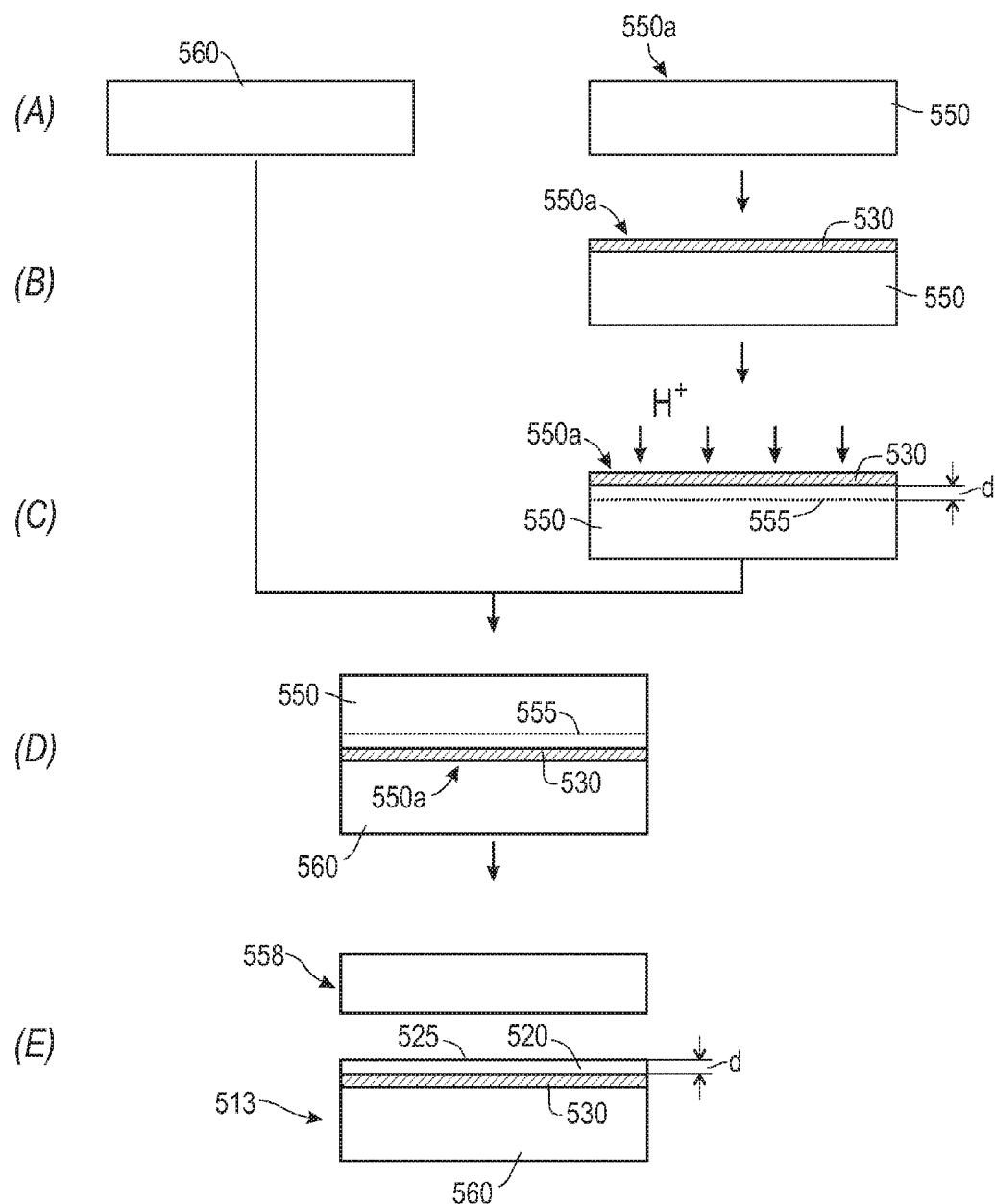
FIG. 5 illustrates processes of a method for manufacturing a composite wafer according to an embodiment.

With respect to FIG. 5 a further embodiment is described. In process (A), a semiconductor wafer 550 is provided, which can be any suitable semiconductor material, particularly Si and SiC. As described in connection with FIG. 3, a bonding layer 530 is formed on the first side 550a of the semiconductor wafer 550 in process (B) and then gas ions such as protons are implanted into the first side 550a to form a delamination layer 555 at a predefined depth d in process (C).

A carrier wafer 560 is provided which includes at least a graphite core of turbostratic or amorphous graphite or isostatically pressed graphite or which can be a crystalline graphite wafer. Carrier wafer 560 can include an optional protective layer which is not illustrated in FIG. 5. Carrier wafer 560 can be manufactured by any suitable process as described herein.

Carrier wafer 560 is then bonded to the semiconductor wafer 550 through bonding layer 530 in process (D) which shows semiconductor wafer 550 turned up-side down in contact with carrier wafer 560. A protective layer (not shown) can be formed on the entire exposed surface of the bonded wafers or only on carrier wafer 560 if desired.

By means of a thermal treatment as illustrated in process (E), semiconductor wafer 550 is delaminated from the carrier wafer 560 along delamination layer 555 so that a semiconductor layer 520 having a thickness d remains attached to carrier wafer 560. This process produces a composite wafer 513 and part-wafer 558 which can be reused as described above. Semiconductor layer 520 includes a cleavage surface 525 along which the delamination or separation occurs and which can be polished or etch to form a flat and defect-free surface. A further semiconductor layer can be epitaxially deposited on semiconductor layer 520 to increase the total thickness of the crystalline semiconductor material disposed on carrier wafer 360.

According to an embodiment, a method for manufacturing a composite wafer is provided. The method includes providing a monocrystalline semiconductor wafer having a first side and a second side arranged opposite to the first side; implanting gas ions into the first side of the monocrystalline semiconductor wafer to form a delamination layer in a predefined depth; providing a carrier wafer having a graphite core and a protective structure encapsulating the graphite core; bonding the carrier wafer to the first side of the monocrystalline semiconductor wafer substrate; and subjecting the monocrystalline semiconductor wafer and the carrier wafer to a heat treatment for splitting the monocrystalline semiconductor wafer along the delamination layer.

The temperature stability of the composite wafer as described herein is not impaired compared to the temperature stability of pure silicon wafers due to the thermal stability of graphite. Furthermore, graphite exhibits similar mechanical properties as silicon and silicon carbide and therefore does not interfere with these materials. Graphite is also sufficiently mechanically stable to be suitable as carrier material. Moreover, graphite is chemically inert against most or nearly all chemicals typically used in the semiconductor processing technology. Furthermore, graphite can be mechanically processed such as grinded, for example to form thin devices. Moreover, graphite can also be deposited by CVD. Since graphite can be formed in an appropriate manner before the processing of the actual semiconductor devices or circuits starts, the graphite deposition, bonding or formation do not interfere with the device processing. It is, however also possible to form the graphite carrier or core or to bond the graphite carrier at a later stage.

Using a graphite carrier or core as described herein also allows thinning of the device layer (semiconductor layer 20, 320, 520 with or without additional epitaxial layer) before device processing starts. This also reduces the costs since the critical process of thinning the device layer is shifted to stages before the actual device processing starts. It is further possible to start with an already thinned semiconductor wafer substrate with subsequent formation of the graphite carrier on that wafer. Formation of the graphite carrier as described herein is mechanically less critical than, for example, bonding. Alternatively, the thinned semiconductor wafer substrate can be brought into contact with a separately formed graphite carrier. For both options, the thermal and chemical stability of graphite, particularly when covered by a protective layer, is helpful. This furthermore reduces the production costs.

As described herein, a device layer can be formed and its target thickness well defined. This can be done by using a suitable etching stop layer and epitaxial deposition of a semiconductor layer on semiconductor wafer used as intermediate substrate to build up the composite wafer as described herein.

Graphite can be protected against chemical attack of oxygen and hydrogen at high temperatures by forming a protective layer preventing oxygen or hydrogen diffusion. Suitable barrier materials include crystalline silicon, polysilicon, amorphous silicon, silicon carbide and silicon nitride to name few. On the other hand, graphite can be removed, if desired, by oxygen or hydrogen in plasma without any residues. The removal is very selective with respect to other materials used in semiconductor processing. Different to other carrier systems, no residues such as glue residues or foil residues remain on the device.

By using a graphite carrier or core, a significant cost reduction in comparison to common SOI wafers can be achieved. Furthermore, when using an insulating intermediate layer between the semiconductor layer and the graphite core, devices with a SOI-structure can be manufactured. The size of such devices can be reduced without requiring pn-junctions for vertical insulation since the insulating intermediate layer forming a buried insulating layer serves as vertical insulation. The material for the insulating intermediate layer can be selected according to specific needs. Intermediate layer can be a single layer or a layer stack.

With respect to FIG. 6 a further embodiment is described. In process (A), a semiconductor wafer 650 having a first side or surface 650a is provided. The semiconductor wafer 650 can also be referred as donor-wafer since it is used to provide a semiconductor layer on a carrier wafer. The donor or semiconductor wafer 650 can be made of any suitable semiconductor material, and particularly of semiconductor materials having a large band gap. Examples are SiC, GaN, GaAs and other semiconductor materials, as well as stacks of different semiconductor materials.

First side 650a constitutes a bonding surface of the semiconductor wafer 650. In process (B), gas ions such as protons are implanted into the first side 650*a* to form a delamination layer or delamination interface 655 at a predefined depth d as described above.

A metallisation layer 670 is formed on the first side 650*a* of the semiconductor wafer 650 as illustrated in process (C). Metallisation layer 670 is formed by metals which can provide a good ohmic contact to the semiconductor material of semiconductor wafer 650. Suitable metals are, for example, Ni, Mo, W, Ta, Nb, Ti, Cr, Al, Cu and V. Such metals form, for example with SiC, an ohmic contact during thermal treatments which can be part of subsequent processes. One such process is an epitaxial growth process for forming a drift region capable of blocking high reverse voltages. A process for forming an epitaxial layer will be described later.

The above-mentioned metals are also carbide-forming metals which allow them to react with carbon or a graphite layer of a carrier wafer which will be later bonded to the semiconductor wafer 650. The metallisation layer 670 can therefore form a stable, reliable and durable low-ohmic electrical connection between the semiconductor wafer 650 and the carrier wafer. Metallisation layer 670 can have a thickness, for example, in a range from about 0.02 μm to about 10 μm or in a range from about 0.05 μm to about 1 μm. After the deposition process a polishing step like e. g. CMP can take place.

A carrier wafer 660 is provided which includes at least a graphite layer or core, which can be made of turbostratic or amorphous graphite, or which includes a crystalline graphite wafer or an isostatically pressed graphite wafer. Carrier wafer 660 can have an optional coating made out of a metal like, for example, Ni, Mo, W, Ta, Ti, Cr, Nb, Al, Cu and V. Metal coating may not spread over the whole carrier wafer and may be, for example, limited to the whole or a part of the surface of carrier wafer 660 bonded to the metallisation layer 670. Metal coating of the carrier wafer optionally can be annealed by thermal treatment prior to process step shown in FIG. 6. Metal coating is not illustrated in FIG. 6. Carrier wafer 660 can include an optional protective layer which is not illustrated in FIG. 6. A protective layer 338 is illustrated in FIG. 3. Carrier wafer 660 can be manufactured by any suitable process as described herein. According to an embodiment, the protective layer, for example as shown in FIGS. 2B or 3, may cover for example only a part of the carrier wafer 660 while leaving an open area for the metallisation layer 670. Metallisation layer 670 may form together with the protective layer a protective structure. According to an embodiment, the protective layer covers the whole carrier wafer 660 also underneath the metallisation layer 670. According to further embodiments, the protective layer covers the carrier wafer 660 and at least part of the semiconductor wafer 650.

Carrier wafer 660 is bonded to the semiconductor wafer 650 through metallisation layer 670 in process (D) which shows semiconductor wafer 650 turned up-side down in contact with carrier wafer 660. A protective layer (not shown) can be formed on the entire exposed surface of the bonded wafers or only on carrier wafer 660 if desired.

By means of a thermal treatment as illustrated in process (E), semiconductor wafer 650 is delaminated from the carrier wafer 660 along delamination layer or delamination interface 655 so that a semiconductor layer 620 having a thickness d remains attached to carrier wafer 660. This process produces a composite wafer 613 and part-wafer 658, the latter one can be reused as described above. Semiconductor layer 620 of composite wafer 613 includes a cleavage surface 625 along which the delamination or separation occurs and which can be polished or etched to form a flat and defect-free surface. A further semiconductor layer can be epitaxially deposited on semiconductor layer 620 to increase the total thickness of the crystalline semiconductor material disposed on carrier wafer 660.

Metallisation layer 670 constitutes a bonding layer between carrier wafer 660 and semiconductor layer 620 and additionally provides a good ohmic electrical connection between semiconductor layer 620 and carrier wafer 670.

By means of an epitaxial process, as illustrated in process (F), an epitaxial layer 680 is grown on the cleavage surface 625 of the semiconductor layer 620. The epitaxial process is carried out under high temperatures up to about 1500° C. Under such high temperatures, the metallisation layer 670 forms an ohmic contact, for example by forming a metal silicide interfacial layer, with the semiconductor material of the semiconductor layer 620 and also a metal carbide interfacial layer with the graphite core of the carrier wafer 660.

Epitaxial layer 680 can have a thickness from about 0.1 μm to about 100 μm or in a range from about 1 μm to about 20 μm. Epitaxial layer 680 can be in-situ doped during deposition. Typically, epitaxial layer 680 is n-doped with a doping concentration from about $10^{13}$ doping atoms per $cm^3$ to about $10^{18}$ doping atoms per $cm^3$. Epitaxial layer 680 can also be p-doped if desired.

Exposed surface 681 of the epitaxial layer 680 forms the front surface of the composite wafer 613 at which most of the active structures of the devices to be manufactured will be formed. Such structures include trenches for gate electrodes, field electrodes or lateral insulations, and doping regions such as body regions or source regions.

One or more epitaxial layers can also be deposited on semiconductor layers 220, 320 or 520 as described above. The epitaxial layer or layers will be typically of the same semiconductor material as the semiconductor layers 220, 320, 520 or 620. It also possible to use different semiconductor materials as described further below.

With respect to FIG. 7 a further embodiment is described. In process (A), a semiconductor wafer 750 having a first side or surface 750*a* is provided, which can be any suitable semiconductor material, particularly Si, SiC, GaN and GaAs. First side 750*a* forms a bonding surface of the semiconductor wafer 750.

In process (B), p-type dopants are implanted into the semiconductor wafer 750 at its first side 750*a* to form a p-doped region 754. Such a region 754 may form a p-emitter for IGBTs or similar devices.

Semiconductor wafer 750 may be comprised of a lowly doped n-type material, for example SiC. The doping concentration can be about $1*10^{15}/cm^3$ to about $1*10^{17}/cm^3$. The p-type dopants such as Al or B are implanted and subsequently subjected to a thermal treatment for activating the dopants. Thermal treatment or annealing can be carried out, for example, at about 1700° C.

In a further process as illustrated in (C), gas ions such as protons are implanted into the first side 750*a* to form a delamination layer or delamination interface 755 at a predefined depth d.

Alternatively, annealing for activating the p-type dopants can be carried out at a later stage or can be part of other thermal treatments such as epitaxial growth as described above. Furthermore, thermal treatments will also occur during processing of the later formed front surface of the composite semiconductor wafer where most of the active structures will be integrated. The processes used for processing the front surface include implantation, deposition and annealing which are carried out at different elevated temperatures. These processes will also contribute to the annealing of the p-type dopants implanted into the first side 750a.

Figure 8:
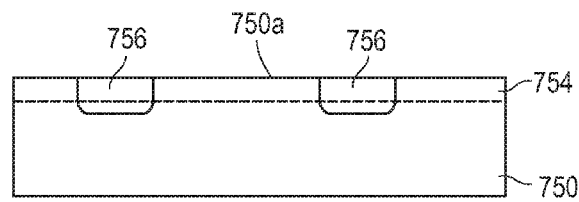
FIG. 8 illustrate a variation of the processes illustrated in FIG. 7.

Additional processes can also be carried out before bonding. For example, n-doped emitter shorts 756 can be formed at the first side 750a of semiconductor wafer 750 by implantation using a mask (not shown) as illustrated in FIG. 8. FIG. 8 illustrates a process which can be carried out subsequently to process (B) of FIG. 7. Alternatively, n-doped emitter shorts 756 can be formed prior to process (B). Moreover, n-doped field stop layers can be additionally or alternatively formed by maskless implantation using, for example, comparably high implantation energy. Field stop layers may improve the electrical characteristic of the final devices.

A metallisation layer 770 as described in connection with FIG. 6 can also be formed at this stage; see for example process (D) in FIG. 7. Basically any process which is usually carried out at the lower or rear surface of a semiconductor wafer can be executed prior to bonding.

A carrier wafer 760 is provided which includes at least a graphite layer or core or which can be a crystalline graphite wafer or an isostatically pressed graphite wafer. Carrier wafer 760 can have an optional coating made out of a metal like, for example, Ni, Mo, W, Ta, Ti, Cr, Nb, Al, Cu and V. Metal coating may not spread over the whole carrier wafer and may be, for example, limited to the whole or a part of the surface of carrier wafer 760 bonded to the metallisation layer 770. Metal coating of the carrier wafer optionally can be annealed by thermal treatment prior to process step shown in FIG. 7. Metal coating is not illustrated in FIG. 7. Carrier wafer 760 can include an optional protective layer which is not illustrated in FIG. 7. Carrier wafer 760 can be manufactured by any suitable process as described herein.

Carrier wafer 760 is bonded in process (E) to semiconductor wafer 750 through metallisation layer 770. When no metallisation layer 770 was formed, carrier wafer 760 is bonded to first side or surface 750a of semiconductor wafer 750 either directly or through an optional bonding layer such as a graphite layer as explained further below.

As described above, by means of thermal treatment, as illustrated in process (F), semiconductor wafer 750 is delaminated from the carrier wafer 760 along delamination layer or delamination interface 755 so that a semiconductor layer 720 having a thickness d remains attached to carrier wafer 760. This process produces a composite wafer 713 and part-wafer 758, the latter one can be reused as described above. Semiconductor layer 720 includes a cleavage surface 725 along which the delamination or separation occurs and which can be polished or etch to form a flat and defect-free surface. A further semiconductor layer can be epitaxially deposited on cleavage surface 725 of semiconductor layer 720 after an optional polishing process as described above.

Epitaxial processes are often carried out in a hydrogen atmosphere. To reduce or to avoid reaction between hydrogen and the graphite of the carrier wafer, additional measures can be provided. Particularly open porous graphite can be prone to hydrogen reaction.

According to an embodiment, graphite having a low amount of pores or even substantially pore-free graphite can be used as material for the carrier wafers 215, 336, 560, 660, 760. Such graphite can be glass-like or vitreous carbon or the above-described pyrolytically deposited carbon.

According to an embodiment, a graphite carrier wafer having an open porous structure can be covered by or its surface converted into a dense protective layer. A protective layer may be formed by pyrolytical deposition of carbon onto the graphite carrier wafer. Furthermore, high-temperature resistant metal carbides can be used to form a protective layer. Examples for metals useful for forming metal carbides are Mo, W, Ni, Ta, Ti, Cr, Nb and V as given above. Furthermore, ternary carbide or ternary nitride layers are also suitable as protective layers. Formation of a protective layer 338 is illustrated, for example, in FIG. 3(E) above.

Figure 9:
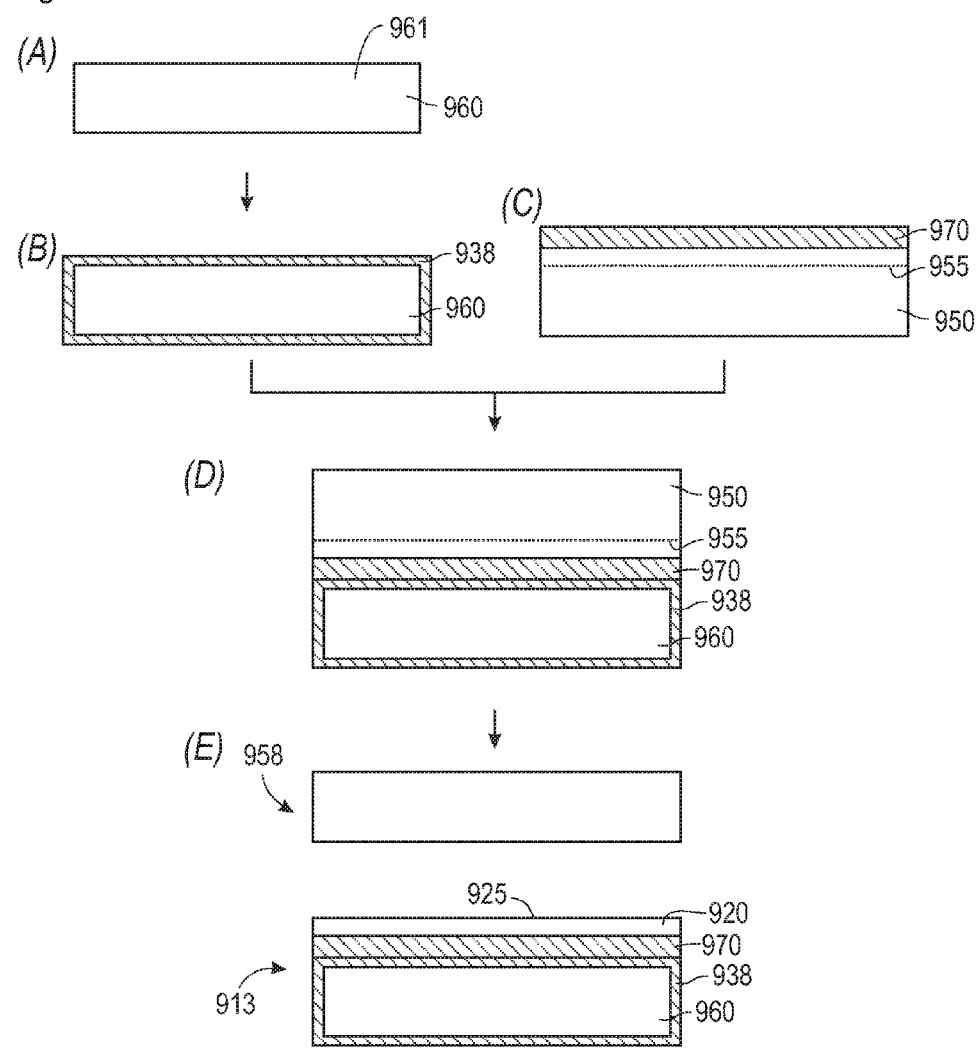
FIG. 9 illustrates processes of a method for manufacturing a composite wafer according to an embodiment.

With reference to FIG. 9 illustrating an embodiment, a metal carbide protective layer can be formed by a metal which is also used for electrically contacting the semiconductor wafer. A carrier wafer 960 having a graphite layer core 961 is provided in process (A). A metal layer 938 is then deposited on the entire surface of the graphite layer or core 961 of carrier wafer 960 as illustrated in process (B). Suitable metals are selected among those which are capable of forming high-temperature stable silicides and carbides. Examples are Mo, W, Ni, Ta, Ti, Cr, Nb and V. The thickness of the metal layer 938 should be sufficient to close open pores of the graphite material of the graphite layer or core 961. The thickness can be, for example, in a range from about 200 nm to about 2 µm.

The carrier wafer 960 having the metal layer 938 is then subjected to a thermal treatment, for example at about 1500° C. for transforming the metal layer into a metal carbide layer 938 which forms a protective layer of the carrier wafer 960. Protective layer 938 can include, for example, TaC or NbC. Depending on the thickness and the duration and temperature of the thermal treatment all or only a portion of the deposited metal will react with the graphite material. Protective layer 938 can therefore include an inner metal carbide layer in contact with the graphite material and an outer metal layer.

The protective layer 938 does not only protect the graphite material but will also prevent that impurities in the graphite material can evaporate during subsequent processes and contaminate semiconductor material. Protective layer 938 is of particular value when a high-temperature epitaxial deposition process is conducted.

The surface of the protective layer 938, to which a semiconductor wafer will be subsequently bonded, can be polished in an optional process. Polishing can be, for example, a CMP process.

The same metal as used for forming the protective layer 938 can also be used for forming a metallisation layer 970 on a semiconductor wafer 950 as described above. A delamination layer or interface 955 might also be formed in semiconductor wafer 950 as described above. Metallisation layer 970 can also be subjected to a CMP process. The situation is illustrated in process (C).

As illustrated in process (D), carrier wafer 960 and semiconductor wafer 950 are bonded at their polished surfaces and then subjected to a thermal treatment in process (E) to delaminate a semiconductor layer 920 from semiconductor wafer 950 as described above. This results in formation of a part-wafer 958 and a composite wafer 913 having the carrier wafer or graphite wafer 960 protected by protective metal carbide layer 938, and metallisation layer 970 and semiconductor layer 920 with cleavage surface 925. As described above, an epitaxial layer can be deposited on cleavage surface 925.

Protective metal carbide layer 938 and metallisation layer 970 form together a reliable, stable and robust electrical connection between carrier wafer 960 and semiconductor layer 920.

The above described processes are not restricted to SiC but can be applied to other semiconductor materials, particularly to semiconductor materials having a larger band gap than Si with the band gap of Si being 1.1 eV, so-called wide-bandgap materials. Examples are GaN and GaAs and derivatives of these materials. The above-described bonding and delamination processes allow effective use of the expensive monocrystalline semiconductor material.

Furthermore, it is also possible to form composite wafers with different semiconductor materials. For example, semiconductor layer 220, 320, 520, 620, 720, 920 can be comprised of a first semiconductor material while epitaxial layer 680 can be comprised of a second semiconductor material different to the first semiconductor material. A specific example is SiC for semiconductor layer 220, 320, 520, 620, 720, 920 and GaN for epitaxial layer 680. Buffer layers are often used for epitaxial growth of GaN on SiC to provide for the lattice mismatch between GaN and SiC. Buffer layers are also needed for compensating the mismatch of the respective coefficients of thermal expansion (CTE).

The CTE of the carrier wafer or graphite layer 215, 336, 560, 660, 760, 960 can be varied to adjust it to the CTE of the material of the semiconductor layer 220, 320, 520, 620, 720, 920. This reduces mechanical tensions between the bonded semiconductor layer 220, 320, 520, 620, 720, 920 and the carrier wafer or graphite layer 215, 336, 560, 660, 760, 960. For example, the CTE of SiC is typically about $3.8*10^{-6}$/K and of GaN typically about $3.17*10^{-6}$/K.

To adjust the CTE of the carrier wafer, blending or mixing compounds can be added to the graphite. Carrier wafers with different, defined CTE values can easily be purchased.

When epitaxially depositing, for example, GaN on a semiconductor layer 220, 320, 520, 620, 720, 920 made of SiC, the number and thickness of buffer layers can be reduced since the SiC semiconductor layer 220, 320, 520, 620, 720, 920 may have only a comparable small thickness. The CTE of the carrier wafer or graphite layer 215, 336, 560, 660, 760, 960 can then be adapted to the CTE of the comparably thick epitaxial GaN layer. This allows formation of a thicker GaN layer, which actually forms the use-layer for final devices, and reduces the costs for the buffer layers. Thicker use-layers for GaN can be used for a higher ampacity or current-carrying capacity per chip area for lateral devices, and can be used to provide vertical devices having a higher blocking voltage.

Hence, the composite wafer 13, 213, 313, 513, 613, 713, 913 may include, according to an embodiment, a graphite carrier or carrier wafer having a graphite layer or core or a graphite carrier or carrier wafer comprised of graphite, a first semiconductor layer of a first semiconductor material bonded to the graphite carrier or graphite layer or core, and a second semiconductor layer of a second semiconductor material on the first semiconductor layer. The CTE of the graphite carrier is adapted to the CTE of the second semiconductor layer. The second semiconductor layer can have a thickness which is larger than the thickness of the first semiconductor layer.

Instead of using a delamination process, the semiconductor wafer 350, 550, 650, 750, 950 can also be polished back to form semiconductor layer 320, 520, 620, 720, 920 bonded to carrier wafer 336, 560, 660, 760, 960.

Figure 10:
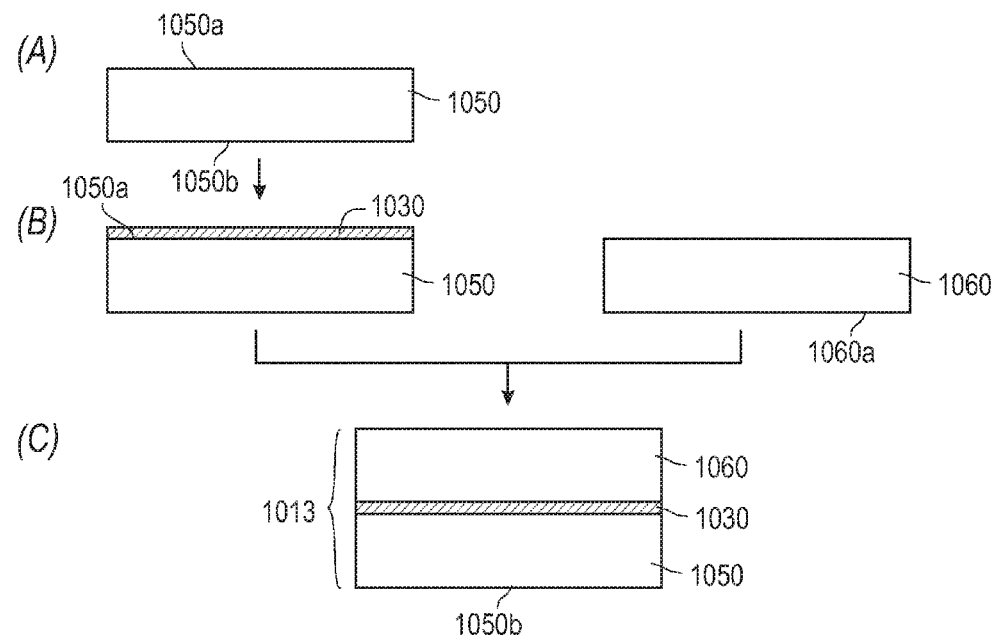
FIG. 10 illustrates processes of a method for manufacturing a composite wafer according to an embodiment.

FIG. 10 illustrates a further embodiment. A first substrate 1050 having a first side 1050a and a second side 1050b is provided as illustrated in process (A). First substrate 1050 can be, for example, a semiconductor wafer. Semiconductor wafer 1050 can be comprised of SiC, GaN, GaAs, derivatives thereof and stacks of different semiconductor materials.

A carbon layer 1030 is formed on the first side 1050a of the first substrate 1050. The carbon layer 1030 can include mesophase carbon, pitch and a mixture thereof. The carbon layer 1030 will be used as a glue or adhesive layer to bond the first substrate 1050 to a second substrate 1060 having a first side 1060a. Second substrate 1060 can be, for example, a carrier wafer having a graphite layer or core as described above, or can be a carrier substrate comprised of graphite.

First substrate 1050 is joined with second substrate 1060 with the carbon layer sandwiched between first and second substrates 1050, 1060 as illustrated in process (C) to form a composite wafer 1013. The joined substrates 1050, 1060 (composite wafer 1013) are (is) subjected to a heat treatment to form a stable and durable bond between the first and the second substrate 1050, 1060. Heat treatment may include pyrolysing the mesophase carbon and pitch to convert the carbon layer into a graphite layer. The mesophase carbon can be provided as paste or as powder.

Figure 11:
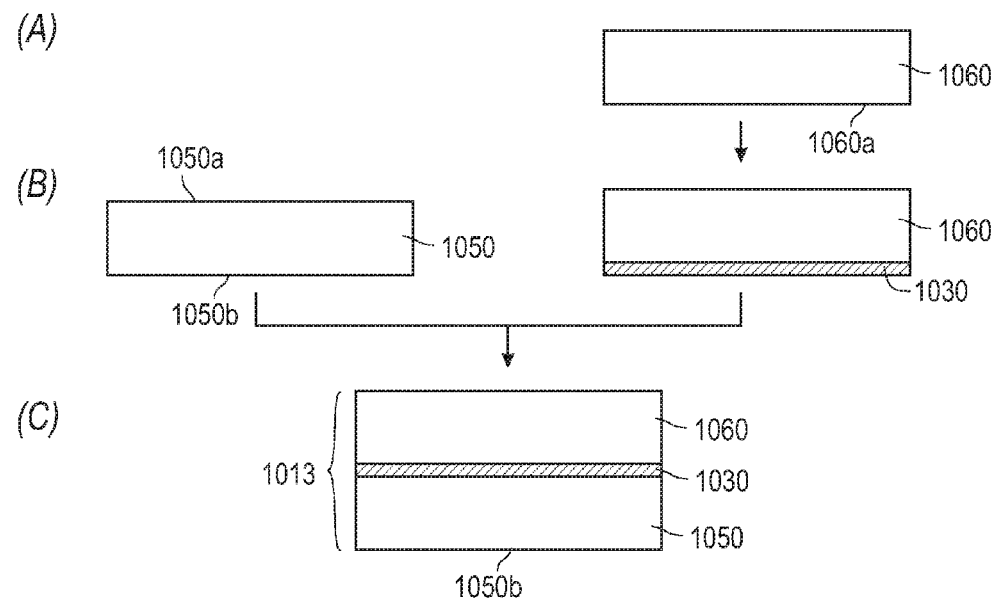
FIG. 11 illustrates processes of a method for manufacturing a composite wafer according to an embodiment.

FIG. 11 illustrates a further embodiment. This embodiment is similar to the embodiment as illustrated in FIG. 10. However, in this embodiment, the carbon layer 1030 is formed on the first side 1060a of second substrate 1060.

According to an embodiment, carbon layer 1030 can also be formed on both the first and the second substrate 1050, 1060.

The above-described approach allows bonding porous graphite layers or carrier wafers including porous graphite directly with other materials. Since the carbon layer used as adhesive will be subjected to a thermal treatment, the substrates should be able to withstand the process temperatures.

The carbon layer 1030 can be applied to one of the substrates 1050, 1060 or to both. Suitable processes for applying the carbon layer 1030 are, for example, spraying, pasting, spinning and rolling. The raw material for the carbon layer 1030 can be liquid pitch, a paste or a powder dispersion.

The first and second substrate 1050, 1060 can be pressed on each other when joining and then annealed at elevated temperature. Liquid solvents included in the raw material for forming the carbon layer 1030 evaporate during the annealing, and the carbon begins to convert into graphite. The porous structure of the graphite of the second substrate 1060 facilitates further evaporation of solvents or other volatile components such as binders in the raw material used for applying the carbon layer or layers 1030.

At the beginning of the joining process, the liquid pitch or the pasty powder may penetrate into open pores at the surface of the graphite layer and may fill unevenness. Heating the substrates 1050, 1060 facilitates this since the pitch becomes more liquid or even liquidates only during heat treatment. When the heat treatment progresses, the carbon layer 1030 increasingly pyrolyses and transforms into a graphite layer which results in a temperature-resistant bond. The heat treatment can be performed directly after joining or at a later stage.

Once the carbon layer 1030 has started to convert into a graphite layer, the substrates 1050, 1060 are irreversibly bonded to each other since the partially or completely converted carbon will not liquidate even under high temperatures. However, debonding might be possible using an oxygen atmosphere. Care should be taken not to affect the substrates.

The completely converted carbon layer 1030 is comprised of graphite which can provide an electrical connection between the first and the second substrate 1050, 1060 as described above.

The above-described processes are particularly suitable to join and bond a graphite material directly with other materials, which should be temperature-resistant to withstand the temperatures applied to convert the carbon (pitch or mesophase carbon) into graphite. For example, a semiconductor wafer such as a SiC wafer can be bonded to a graphite carrier. Furthermore, heater made of graphite can be fixed to substrates which shall be heated using the graphite heater as heating source.

Furthermore, the CTE of the carbon layer 1030 can be adjusted as described above to compensate a mismatch of the CTEs of the first and second substrates 1050, 1060.

Pitch, mesophase carbon and graphite can be manufactured in a grade suitable for semiconductor processing.

The quality of the adhesive bond using the carbon layer 1030 can be evaluated by several techniques. For example, the bond can be subjected to a cross-sectional polishing which reveals the bond. The carbon layer 1030 can be clearly distinguished from the substrates, particularly from semiconductor material and also from the graphite base material of the carrier wafer. Furthermore, Raman spectroscopy and X-ray analysis allows evaluation of the quality and structure of the final carbon layer 1030 and also allows conclusions of the raw material used.

Figure 12:
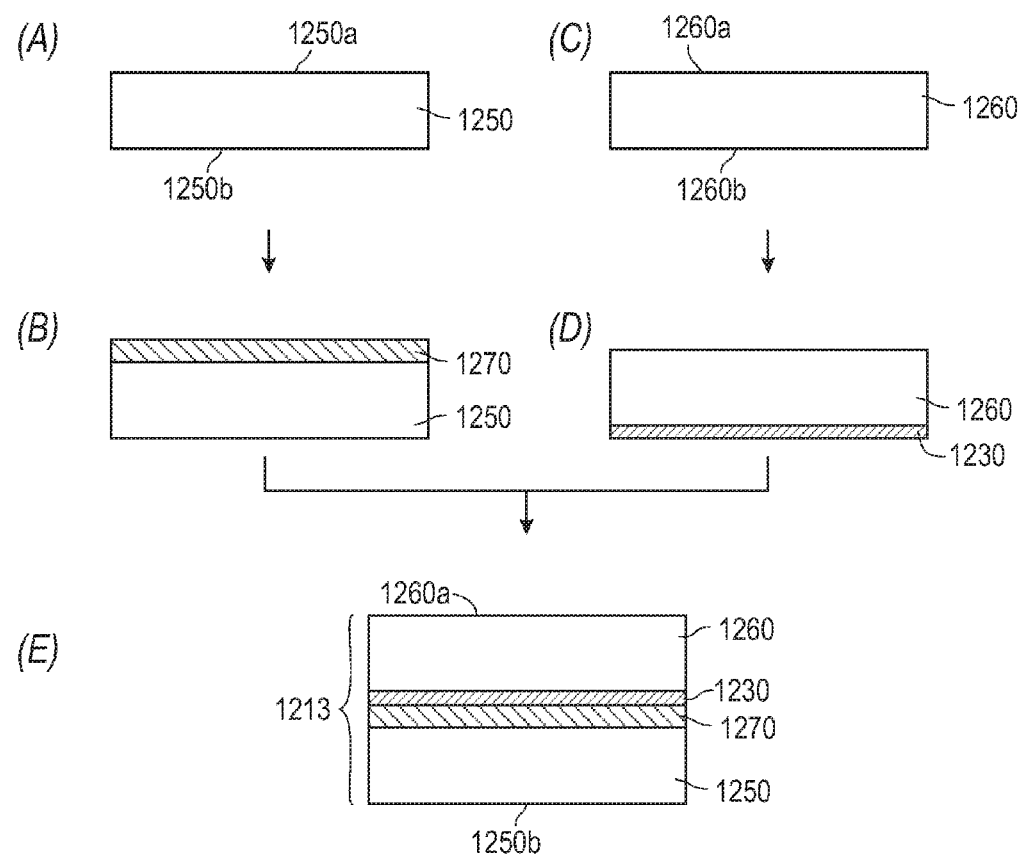
FIG. 12 illustrates processes of a method for manufacturing a composite wafer according to an embodiment.

With reference to FIG. 12, a further embodiment will be described.

A first substrate 1250, such as a semiconductor wafer, having a first side 1250a and a second side 1250b will be provided in process (A). A metallisation layer 1270 will be formed in process (B) on first side 1250a of the first substrate 1250 as described above. A second substrate 1260, such as a carrier wafer having a graphite layer or core, will be provided in process (C). Second substrate 1260 has a first side 1260a and a second side 1260b. A carbon layer 1230 is formed on second side 1260b of second substrate 1260 in process (D) as described above.

In process (E), first and second substrates 1250, 1260 are joined with the carbon layer 1230 and the metallisation layer 1270 sandwiched between the first and the second substrates 1250, 1260 to form a composite wafer 1213.

Figure 13:
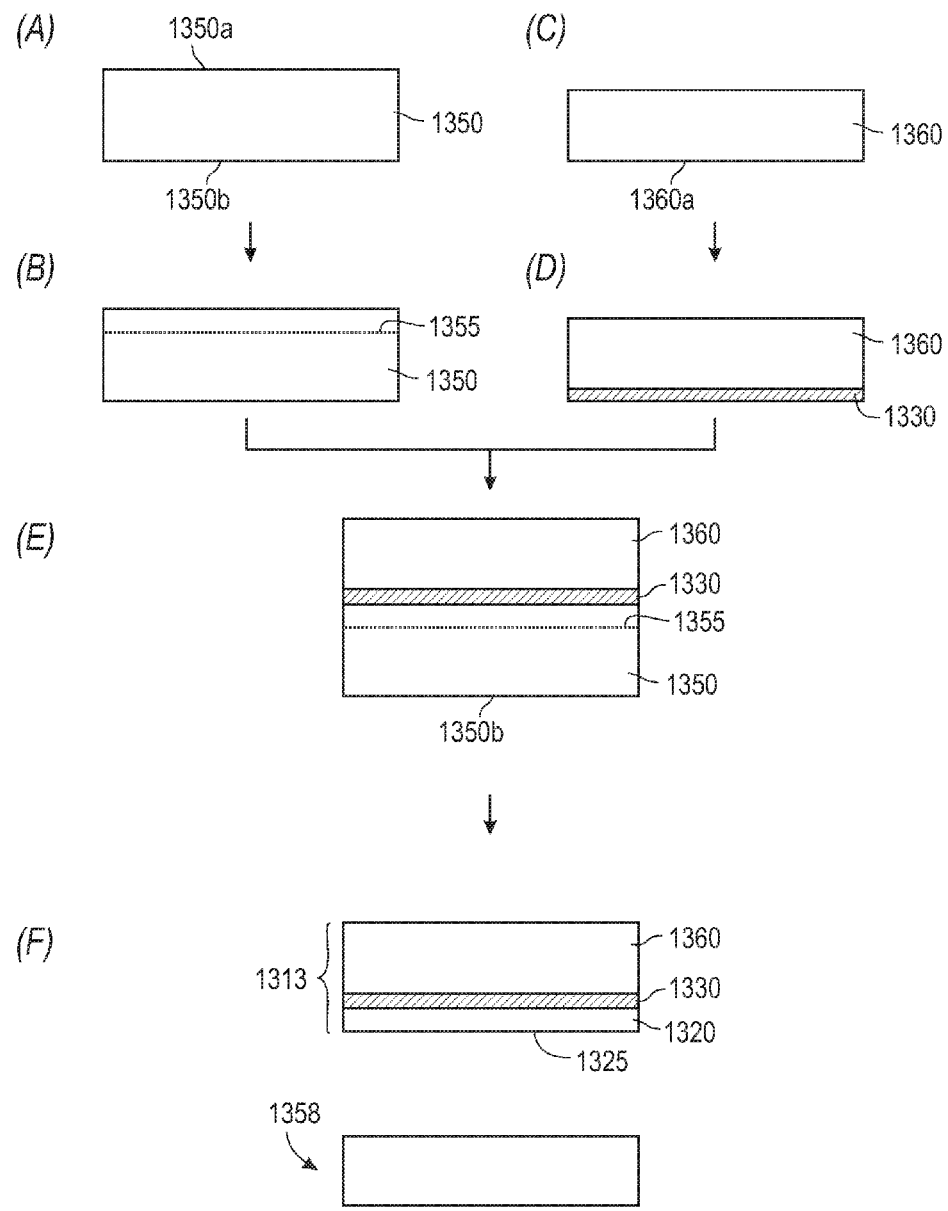
FIG. 13 illustrates processes of a method for manufacturing a composite wafer according to an embodiment.

With reference to FIG. 13, a further embodiment will be described.

A semiconductor wafer 1350 having a first side 1350a and a second side 1350b is provided in process (A). The semiconductor wafer 1350 forms a first substrate. Semiconductor wafer 1350 can be, for example, a SiC-wafer, a GaN-wafer, or a GaAs-wafer. As described further above, a delamination layer 1355 is formed in the semiconductor wafer 1350 in process (B) using a gas implant such as protons.

Furthermore, a graphite wafer 1360 or a carrier wafer 1360 having a graphite layer is provided in process (C). Graphite wafer or carrier wafer 1360 forms here a second substrate having a first side 1360a. A carbon layer 1330 is formed in process (D) on the first side 1360a of the graphite wafer 1360 as described above.

Graphite wafer 1360 and semiconductor wafer 1350 are joined with each other in process (E) so that the carbon layer 1330 is in contact with the first side 1350a of the semiconductor wafer 1350. In one or more subsequent heat treatments, such as high-temperature annealing, carbon layer 1330 is converted into a graphite layer, and the semiconductor wafer 1350 is delaminated along the delamination layer or interface 1355. This results in formation of a composite wafer 1313 having graphite wafer 1360 bonded to a semiconductor layer 1320 through converted carbon layer 1330 (now graphite layer). Semiconductor layer 1320 is a delaminated layer from semiconductor wafer 1350. Cleavage surface 1325 of semiconductor layer 1320 can be polished. An epitaxial layer can be grown on polished cleavage surface 1325.

Alternatively, no delamination occurs but the semiconductor substrate 1350 is polished back to form thin semiconductor layer 1320.

Delamination also results in formation of part-wafer 1358.

Alternatively, a metallization layer 1330 is used instead of carbon layer 1330.

According to an embodiment, a mesophase carbon or pitch capable of sintering is used as adhesive for bonding temperature-resistant materials with a graphite base material such as a graphite carrier wafer. The mesophase carbon or pitch is converted into a temperature-resistant graphite layer by thermal processing. Solvents and pyrolysis products of the mesophase carbon or pitch can evaporate though the open porous structure of the graphite base material. The CTE of the formed graphite layer can be varied by adjusting the composition of the mesophase carbon or pitch and by varying the process parameters for pyrolysing the mesophase carbon or pitch.

According to an embodiment, a method for manufacturing a composite wafer includes providing a monocrystalline semiconductor wafer having a first side and a second side arranged opposite the first side; depositing a moulding composition having at least one of carbon powder and pitch on the second side of the semiconductor wafer; and annealing the deposited moulding composition to form a graphite carrier attached to the semiconductor wafer.

According to an embodiment, the moulding composition further includes a binder.

According to an embodiment, depositing a moulding composition includes at least one of injection moulding and compression moulding.

According to an embodiment, annealing the deposited moulding composition includes a first annealing process in a first temperature range and a subsequent second annealing process in a second temperature range different than the first temperature range.

According to an embodiment, the method includes forming a first protective layer at least on the first side of the monocrystalline semiconductor wafer prior to depositing the moulding composition.

According to an embodiment, the method further includes removing the first protective layer from the monocrystalline semiconductor wafer after depositing the moulding composition or after annealing the deposited moulding composition.

According to an embodiment, the method further includes forming a second protective layer at least on the graphite carrier.

According to an embodiment, the method further includes forming an intermediate layer on the second side of the monocrystalline semiconductor wafer; and depositing the moulding composition on the intermediate layer.

According to an embodiment, the method further includes forming a recess in the second side of the monocrystalline semiconductor wafer; and depositing the moulding composition into the recess.

According to an embodiment, forming a recess includes grinding the second side of the monocrystalline semiconductor wafer; and etching the monocrystalline semiconductor wafer at the second side.

According to an embodiment, the method further includes forming a doping region at the first side of the monocrystalline semiconductor wafer, the doping region forming an etch stop layer; forming an epitaxial semiconductor layer on the first side of the monocrystalline semiconductor wafer; and etching the material of the monocrystalline semiconductor wafer at the second side selectively with respect to the etch stop layer.

According to an embodiment, the method further includes grinding the second side of the monocrystalline semiconductor wafer after forming the epitaxial semiconductor layer.

According to an embodiment, the method further includes reducing the thickness of the monocrystalline semiconductor wafer by removing semiconductor material at the first side of the monocrystalline semiconductor wafer.

According to an embodiment, a method for manufacturing a composite wafer includes providing a carrier wafer having a graphite core and a protective structure encapsulating the graphite core; and bonding a monocrystalline semiconductor wafer to the carrier wafer.

According to an embodiment, providing a carrier wafer includes providing a polycrystalline semiconductor wafer; forming a recess in the polycrystalline semiconductor wafer; depositing a moulding composition having at least one of carbon powder and pitch in the recess of the polycrystalline semiconductor wafer; and annealing the deposited moulding composition to form the graphite core.

According to an embodiment, the method further includes forming a protective layer on the graphite core.

According to an embodiment, a method for manufacturing a composite wafer includes providing a monocrystalline semiconductor wafer having a first side and a second side arranged opposite the first side; implanting gas ions into the first side of the monocrystalline semiconductor wafer to form a delamination layer at a predefined depth in the monocrystalline semiconductor wafer; depositing a moulding composition having at least one of carbon powder and pitch on the first side of the monocrystalline semiconductor substrate; and subjecting the monocrystalline semiconductor wafer and the moulding composition to at least one heat treatment to form a graphite carrier attached to the first side of the semiconductor wafer and split the monocrystalline semiconductor wafer along the delamination layer.

According to an embodiment, the gas ions are implanted into the first side of the monocrystalline semiconductor wafer using implantation energy of no more than 150 keV.

According to an embodiment, splitting of the monocrystalline semiconductor wafer results in the formation of a monocrystalline semiconductor layer which remains attached to the graphite carrier, the monocrystalline semiconductor layer having an exposed side, the method further includes forming an epitaxial semiconductor layer on the exposed side of the monocrystalline semiconductor layer.

According to an embodiment, a composite wafer includes a carrier substrate having a graphite core, and a monocrystalline semiconductor substrate selected from silicon carbide and silicon attached to the carrier substrate.

According to an embodiment, the carrier substrate includes turbostratic or amorphous or isostatically pressed graphite According to an embodiment, the carrier substrate includes a semiconductor rim structure laterally surrounding the graphite core.

According to an embodiment, the carrier substrate includes a semiconductor wafer having a recess, wherein the graphite core is disposed in the recess.

According to an embodiment, a composite wafer includes a carrier substrate having a graphite core and a protective structure encapsulating the graphite core, and a monocrystalline semiconductor layer attached to the carrier substrate.

According to an embodiment, the graphite core includes turbostratic or amorphous or isostatically pressed graphite.

It is to be understood that the features of the various exemplary embodiments described herein may be combined with each other, unless specifically noted otherwise.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a composite wafer, the method comprising:
   providing a carrier wafer comprising graphite and a protective layer, wherein the protective layer is formed to completely encapsulate the carrier wafer comprising graphite;
   forming a bonding layer;
   bonding the carrier wafer to a semiconductor wafer through the bonding layer, the semiconductor wafer comprising a wide band-gap semiconductor material selected from the group consisting of SiC, GaN, derivatives thereof, and combinations thereof; and
   polishing the protective layer prior to bonding.

2. The method of claim 1, wherein the bonding layer is formed on the semiconductor wafer prior to bonding the carrier wafer to the semiconductor wafer.

3. The method of claim 1, wherein bonding the carrier wafer to the semiconductor wafer comprises bonding the protective layer to the bonding layer.

4. The method of claim 3, further comprising:
   polishing the protective layer prior to forming the bonding layer.

5. The method of claim 1, wherein the bonding layer is formed on the protective layer of the carrier wafer prior to bonding the carrier wafer to the semiconductor wafer.

6. The method of claim 5, further comprising:
   polishing the protective layer prior to forming the bonding layer.

7. The method of claim 1, wherein the protective layer of the carrier wafer comprises a metal or a metal carbide.

8. The method of claim 7, wherein the metal of the protective layer is capable of forming at least one of metal carbide and metal silicide.

9. The method of claim 1, wherein polishing the protective layer of the carrier wafer comprises chemically-mechanically polishing.

10. The method of claim 1, further comprising:
polishing the protective layer prior to forming the bonding layer.

11. The method of claim 1, herein the semiconductor wafer comprises a delamination layer.

12. The method of claim 11, further comprising:
subjecting the semiconductor wafer bonded to the carrier wafer to a thermal treatment to delaminate the delamination layer from the semiconductor wafer.

13. The method of claim 11, further comprising:
implanting gas ions into a first side of the semiconductor wafer to form the delamination layer at a predefined depth in the semiconductor wafer prior to bonding; and
subjecting the semiconductor wafer bonded to the carrier wafer to a thermal treatment to delaminate the delamination layer from the semiconductor wafer.

14. The method of claim 12, wherein delamination of the delamination layer from the semiconductor wafer results in the formation of a monocrystalline semiconductor layer which remains attached to the carrier water, the monocrystalline semiconductor layer comprising an exposed side, the method further comprising forming an epitaxial semiconductor layer on the exposed side of the monocrystalline semiconductor layer.

15. The method of claim 14, further comprising:
implanting dopants into the epitaxial semiconductor layer to form at least one doping region in the epitaxial semiconductor layer.

16. The method of claim 1, further comprising:
implanting dopants into the semiconductor wafer to form at least one doping region in the semiconductor wafer.

17. The method of claim 1, wherein the protective layer and the bonding layer are made of different materials.

* * * * *